United States Patent
Gwinn

(10) Patent No.: US 9,236,221 B2
(45) Date of Patent: Jan. 12, 2016

(54) MOLECULAR BEAM ENHANCED GCIB TREATMENT

(71) Applicant: TEL Epion Inc., Billerica, MA (US)

(72) Inventor: Matthew C. Gwinn, Winchendon, MA (US)

(73) Assignee: TEL Epion Inc., Billerica, MA (US)

(*) Notice: Subject to any disclaimer, the term of this patent is extended or adjusted under 35 U.S.C. 154(b) by 0 days.

(21) Appl. No.: 14/550,417

(22) Filed: Nov. 21, 2014

(65) Prior Publication Data

US 2015/0144786 A1     May 28, 2015

Related U.S. Application Data

(60) Provisional application No. 61/907,669, filed on Nov. 22, 2013.

(51) Int. Cl.
| | |
|---|---|
| H01J 37/31 | (2006.01) |
| H01J 49/04 | (2006.01) |
| H01J 37/30 | (2006.01) |
| H01J 37/08 | (2006.01) |

(52) U.S. Cl.
CPC .............. H01J 37/30 (2013.01); H01J 37/08 (2013.01); H01J 2237/0812 (2013.01); H01J 2237/317 (2013.01)

(58) Field of Classification Search
CPC .............. H01J 37/317; H01J 37/3171; H01J 37/32816; H01J 49/005; H01J 49/04; H01L 21/256; H01L 21/26566; C23C 14/221; C23C 14/5833
USPC .......... 250/282, 492.2, 492.21, 492.3, 423 R, 250/424, 492.1, 288, 425, 432 R; 204/192.3, 204/192.34, 192.32, 192.31, 298.36; 438/474, 515, 706; 257/E21.162, 257/E21.334, E21.343
See application file for complete search history.

(56) References Cited

U.S. PATENT DOCUMENTS

| | | | | |
|---|---|---|---|---|
| 5,527,731 | A * | 6/1996 | Yamamoto et al. | 250/492.3 |
| 5,814,194 | A * | 9/1998 | Deguchi et al. | 204/192.1 |
| 6,486,478 | B1 * | 11/2002 | Libby et al. | 250/492.1 |
| 6,770,874 | B2 * | 8/2004 | Dykstra | 250/287 |
| 6,781,117 | B1 * | 8/2004 | Willoughby et al. | 250/281 |
| 6,831,272 | B2 * | 12/2004 | Mack et al. | 250/287 |
| 7,060,989 | B2 * | 6/2006 | Swenson et al. | 250/423 R |
| 7,173,252 | B2 * | 2/2007 | Mack | 250/423 R |
| 7,253,406 | B1 * | 8/2007 | Sheehan et al. | 250/288 |
| 7,550,748 | B2 * | 6/2009 | Caliendo et al. | 250/492.21 |
| 7,834,327 | B2 * | 11/2010 | Regan | 250/423 R |
| 8,097,860 | B2 * | 1/2012 | Tabat et al. | 250/424 |
| 8,217,372 | B2 * | 7/2012 | Harrison | 250/492.22 |
| 8,293,126 | B2 | 10/2012 | MacCrimmon et al. | |

(Continued)

OTHER PUBLICATIONS

International Searching Authority, International Search Report and Written Opinion issued in corresponding Application No. PCT/US14/66888 dated Mar. 3, 2015, 10 pp.

(Continued)

Primary Examiner — David A Vanore

(74) Attorney, Agent, or Firm — Wood, Herron & Evans, LLP

(57) ABSTRACT

A method and system for performing gas cluster ion beam (GCIB) etch processing of various materials is described. In particular, the GCIB etch processing includes using one or more molecular beams to optimize pressure at localized regions of the ion beam.

20 Claims, 21 Drawing Sheets

(56) References Cited

U.S. PATENT DOCUMENTS

| | | | |
|---|---|---|---|
| 8,304,033 B2* | 11/2012 | Tabat et al. | 427/523 |
| 8,455,060 B2* | 6/2013 | Tabat | 427/595 |
| 8,512,586 B2* | 8/2013 | Tabat et al. | 216/72 |
| 8,513,138 B2* | 8/2013 | Shao et al. | 438/738 |
| 8,722,542 B2 | 5/2014 | Olsen et al. | |
| 8,728,947 B2 | 5/2014 | Olsen et al. | |
| 8,877,299 B2* | 11/2014 | Hautala et al. | 427/534 |
| 2006/0102854 A1* | 5/2006 | Neogi et al. | 250/492.1 |
| 2008/0047487 A1 | 2/2008 | Doolittle et al. | |
| 2008/0142735 A1 | 6/2008 | Chandler et al. | |
| 2008/0245974 A1* | 10/2008 | Kirkpatrick et al. | 250/492.21 |
| 2010/0193472 A1 | 8/2010 | Tabat et al. | |
| 2010/0193701 A1 | 8/2010 | Tabat et al. | |
| 2012/0045615 A1* | 2/2012 | Kirkpatrick et al. | 428/141 |
| 2013/0059449 A1* | 3/2013 | Hautala et al. | 438/714 |
| 2014/0236295 A1* | 8/2014 | Khoury et al. | 623/13.11 |
| 2014/0332679 A1* | 11/2014 | Blenkinsopp et al. | 250/282 |
| 2014/0332696 A1* | 11/2014 | Gwinn et al. | 250/453.11 |
| 2014/0363678 A1* | 12/2014 | Kirkpatrick et al. | 428/408 |
| 2015/0056815 A1* | 2/2015 | Fernandez et al. | 438/712 |
| 2015/0090874 A1* | 4/2015 | Larson et al. | 250/282 |

OTHER PUBLICATIONS

U.S. Appl. No. 14/696,063, filed Apr. 24, 2015, 64 pp.

* cited by examiner

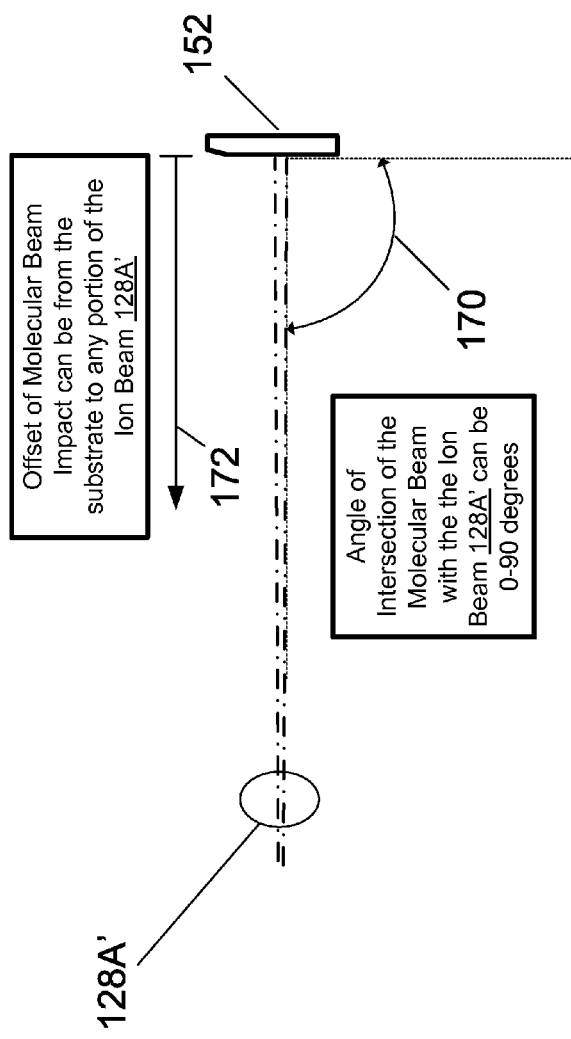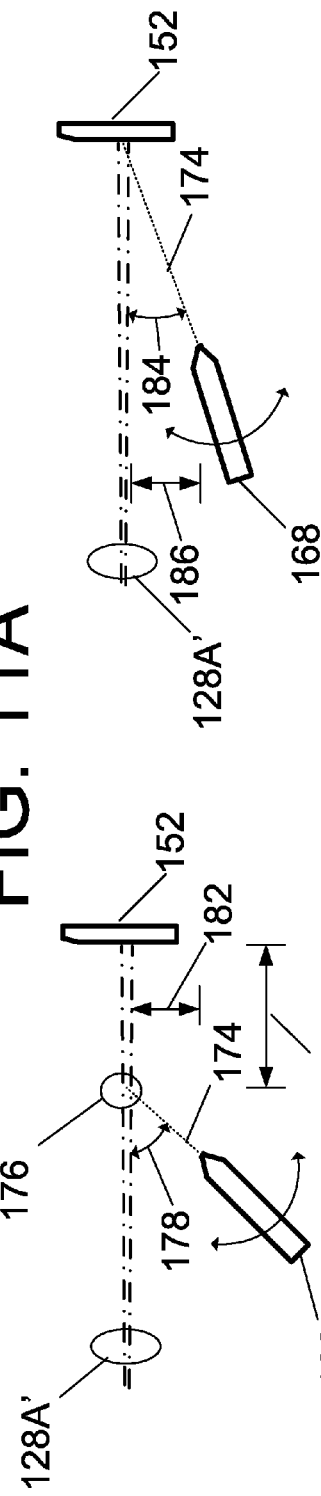

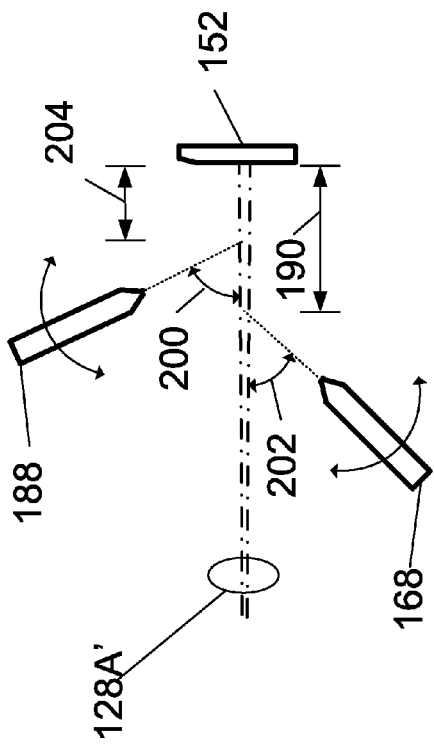
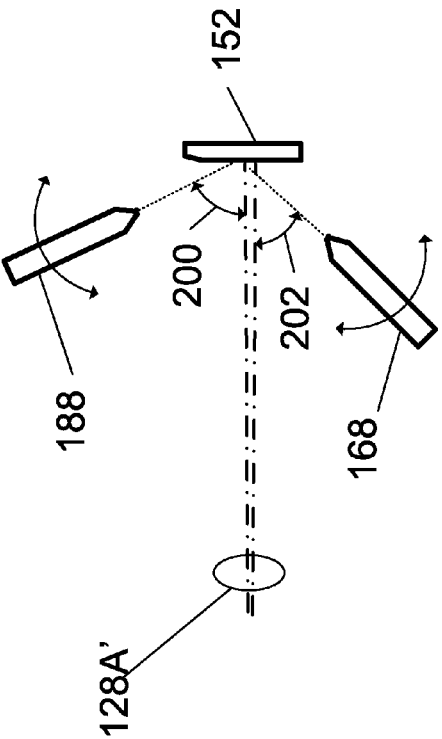
FIG. 12E
FIG. 12F
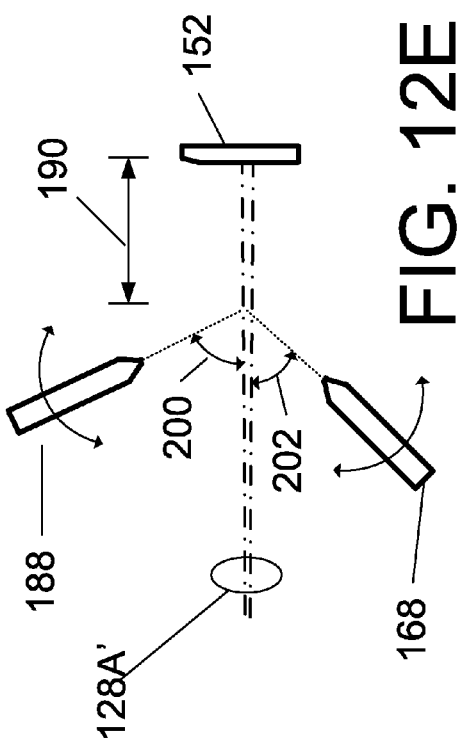
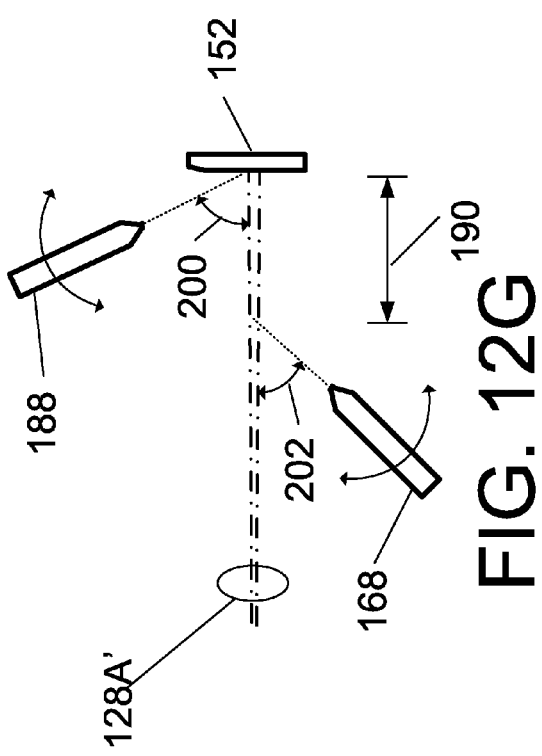
FIG. 12G
FIG. 12H

MOLECULAR BEAM ENHANCED GCIB TREATMENT

CROSS REFERENCE TO RELATED APPLICATIONS

Pursuant to 37 C.F.R §1.78(a)(4), the application claims the benefit of and priority to filed co-pending Provisional Application Ser. No. 61/907,669 filed Nov. 22, 2013 and is incorporated by reference in its entirety herein.

FIELD OF INVENTION

The invention relates to gas cluster ion beam (GCIB) processing.

BACKGROUND OF THE INVENTION

Typically, during fabrication of an integrated circuit (IC), semiconductor production equipment utilize a (dry) plasma etch process to remove or etch material along fine lines or within vias or contacts patterned on a semiconductor substrate. The success of the plasma etch process requires that the etch chemistry includes chemical reactants suitable for selectively etching one material while etching another material at a substantially lesser rate. Furthermore, the success of the plasma etch process requires that acceptable profile control may be achieved while applying the etch process uniformly to the substrate.

In present IC devices, Si-containing and Ge-containing materials are a mainstay in semiconductor processing. However, more exotic materials are also being introduced to semiconductor processing to improve various electrical properties of the IC devices. For example, in front-end-of-line (FEOL) semiconductor processing, high dielectric constant (high-k) materials are desirable for use as transistor gate dielectrics. Preliminary high-k materials used in this role were tantalum oxide and aluminum oxide materials. Currently, hafnium-based dielectrics and possibly lanthanum-based dielectrics are expected to enter production as gate dielectrics. Moreover, in FEOL semiconductor processing, metal-containing materials are desirable for use as transistor gate electrodes in future generations of electronic devices. Currently, metal electrodes containing Ti, Ta, and/or Al (e.g., TiN, TaN, $Al_2O_3$, and TiAl) are expected to enter production as metal electrodes. Of course, the introduction of new materials to semiconductor processing is not limited to only FEOL operations, but is also a trend in metallization processes for back-end-of-line (BEOL) operations. Moreover, in advanced memory devices, new and exotic materials are used and introduced, including Fe, Co, Ni, and alloys thereof, as well as noble metals.

With current materials and the advent of these new materials in electronic device processing, the ability to etch these current and new materials while maintaining the integrity of pre-existing layers and/or structures faces formidable challenges. Conventional etch processes may not achieve practical etch rates of these materials or attain an acceptable etch selectivity relative to underlying or overlying materials. Moreover, conventional etch processes may not achieve acceptable profile control that is uniformly applied across the substrate.

SUMMARY OF THE INVENTION

Embodiments of the invention relate to GCIB processing. In particular, embodiments of the invention relate to GCIB etch processing. Furthermore, embodiments of the invention relate to GCIB etch processing of various materials to achieve target etch process metrics.

According to one embodiment the GCIB system may include a GCIB generating system and a molecular beam generating system that may be used in conjunction to treat a substrate within a vacuum chamber. The GCIB and the molecular beam(s) may interact with each other within the vacuum chamber or with the substrate directly. For example, the interaction may occur an offset distance from an exposed surface of the substrate or at the exposed surface of the substrate. The angle of incidence between the GCIB and the molecular beam may range from 0 to 90 degrees. In on specific embodiment, the angle of incidence may range from 5 to 45 degrees. In these embodiments, the GCIB may have an angle of incidence with the substrate from 0 to 90 degrees. The GCIB may include a high pressure nozzle, a nozzle skimmer located beyond an exit of said high pressure nozzle, an ionizer located beyond an exit of said nozzle skimmer, and one or more accelerating electrodes.

In another embodiment, the GCIB system may include two or more molecular beam sources that may be used to interact with the GCIB and/or the substrate at the same or similar time. The molecular beam source may interact with the GCIB at the same point or may interact at different points on the GCIB. Likewise, the angle of incidence between the molecular beams and the GCIB may vary and are not required to be the same. In one embodiment, the molecular beams may comprise a nitrogen-containing gas, argon, or a combination thereof. In another embodiment, the molecular beams may also include additional reactive gases (e.g., oxygen-containing gas, halogen-containing gas, etc.).

In one method embodiment, the GCIB system may dispose a substrate onto a substrate holder that may within the vacuum chamber. A GCIB and a molecular beam may be generated within the vacuum chamber and they may physically interact with each and/or the substrate to etch, deposit on, or smooth the substrate.

BRIEF DESCRIPTION OF THE DRAWINGS

In the accompanying drawings:

FIGS. 11A-11C are illustrations of an ion beam that may be intersected with a molecular beam according to one or more embodiments;

FIGS. FIG. 12A-12H are illustrations of an ion beam that may be intersected with a molecular beam according to one or more embodiments;

DETAILED DESCRIPTION OF SEVERAL EMBODIMENTS

Figure 1:
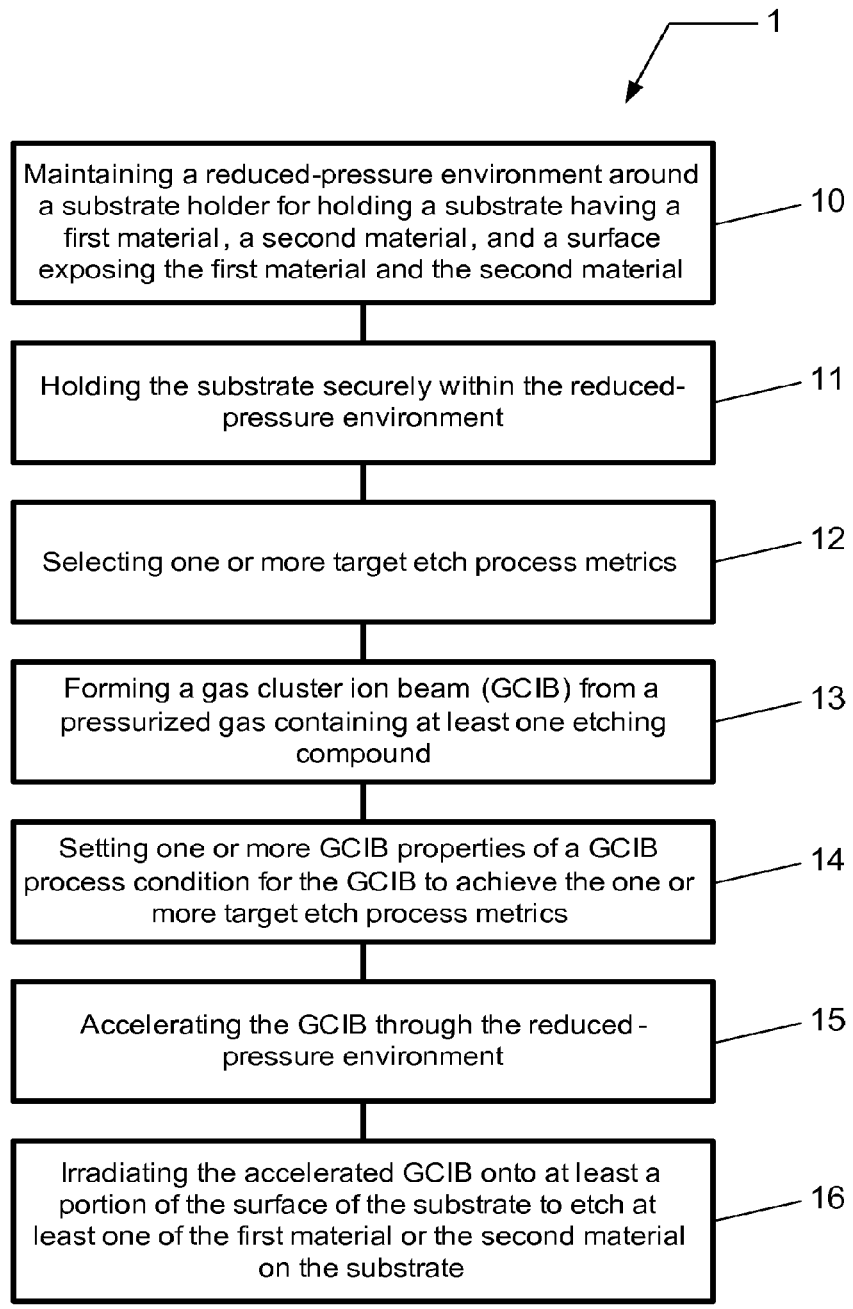
FIG. 1 is a flow chart illustrating a method for etching a substrate according to an embodiment.

Methods for etching layers, including silicon-containing, Ge-containing, metal-containing, and semiconductor layers, on a substrate using gas cluster ion beam (GCIB) processing are described in various embodiments. One skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

"Substrate" as used herein generically refers to the object being processed in accordance with the invention. The substrate may include any material portion or structure of a device, particularly a semiconductor or other electronics device, and may, for example, be a base substrate structure, such as a semiconductor wafer or a layer on or overlying a base substrate structure such as a thin film. Thus, substrate is not intended to be limited to any particular base structure, underlying layer or overlying layer, patterned or unpatterned, but rather, is contemplated to include any such layer or base structure, and any combination of layers and/or base structures. The description below may reference particular types of substrates, but this is for illustrative purposes only and not limitation.

As described in part above, etch rate, etch selectivity, profile control, including CD (critical dimension) control, and surface roughness provide, among other process results, essential metrics for determining successful pattern etching. As an example, when transferring a feature pattern into a material layer on a substrate, it is important to selectively etch one material at a rate sufficient for adequate process throughput, while controlling the pattern profile and surface roughness of pattern surfaces as well as adjacent surfaces. Furthermore, it is important to control the etch rate, etch selectivity, and etch profile uniformly for all feature patterns formed in the material layer on the substrate, and/or spatially adjust the control of these parameters for feature patterns formed in the material layer on the substrate.

Therefore, according to various embodiments, methods for etching materials on a substrate, such as Si-containing material, Ge-containing material, metal-containing material, semiconductor material, and/or chalcogenide material, are described. Referring now to the drawings wherein like reference numerals designate corresponding parts throughout the several views, FIG. 1 provides a flow chart 1 illustrating a method for etching various materials on a substrate according to an embodiment. Furthermore, exemplary methods for etching a substrate are graphically depicted in FIGS. 2A and 2B.

The method illustrated in flow chart 1 begins in 10 with maintaining a reduced-pressure environment around a substrate holder for holding substrate 22 in a gas cluster ion beam (GCIB) processing system. Substrate 22 may include a first material, a second material, and a surface exposing the first material and/or the second material. The GCIB processing system may include any one of the GCIB processing systems (100, 100' or 100") described below in FIG. 5, 6 or 7, or any combination thereof.

Figure 2A:
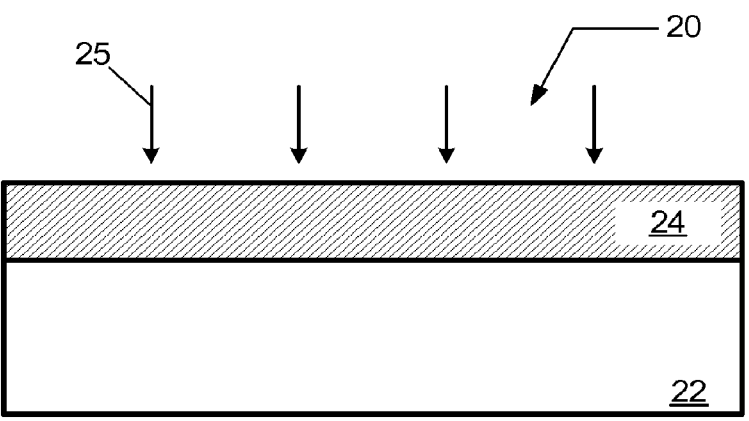
FIGS. 2A through 2C illustrate in schematic view methods for etching a substrate according to other embodiments.

As illustrated in FIG. 2A, a material layer 24 overlying at least a portion 20 of a substrate 22 may be etched using GCIB 25. As an example, the first material may include material layer 24 and the second material may include substrate 22. The surface exposing the first material and/or the second material may include the upper surface of material layer 24 during etching of material layer 24, or the interface between material layer 24 and substrate 22 once etching proceeds through material layer 24.

Figure 2B:
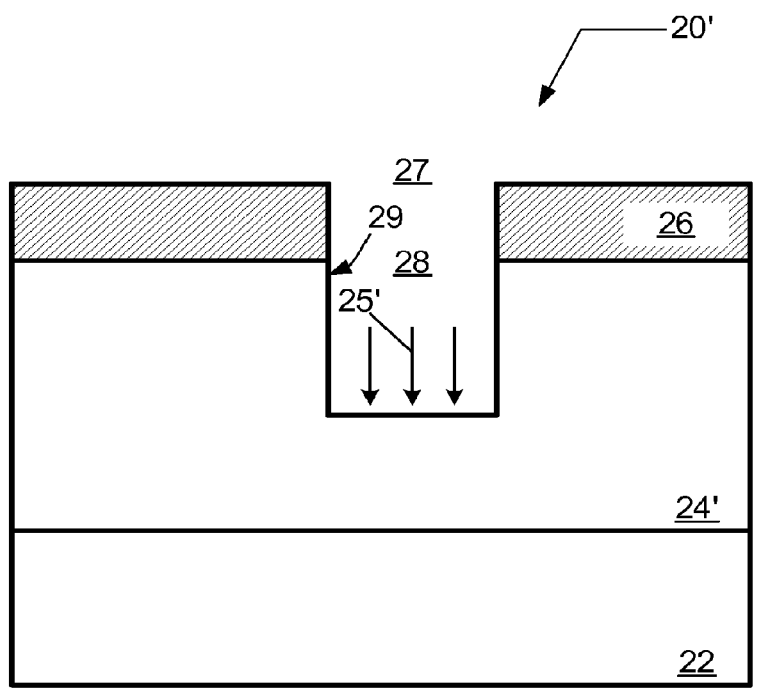

Alternatively, as illustrated in FIG. 2B, a material layer 24' overlying at least a portion 20' of substrate 22 may be etched using GCIB 25' to transfer a first pattern 27 formed in a mask layer 26 to material layer 24' to produce a second pattern 28 therein. As an example, the first material may include mask layer 26 and the second material may include material layer 24'. The surface exposing the first material and/or the second material may include the exposed surface of mask layer 26 and the exposed surface of material layer 24'.

As illustrated in FIG. 2B, mask layer 26 having first pattern 27 formed therein is prepared on or above material layer 24'. The mask layer 26 may be formed by coating substrate 22 with a layer of radiation-sensitive material, such as photo-resist. For example, photo-resist may be applied to the substrate using a spin coating technique, such as those processes facilitated by a track system. Additionally, for example, the photo-resist layer is exposed to an image pattern using a lithography system, and thereafter, the image pattern is developed in a developing solution to form a pattern in the photo-resist layer.

The photo-resist layer may comprise 248 nm (nanometer) resists, 193 nm resists, 157 nm resists, or EUV (extreme ultraviolet) resists. The photo-resist layer can be formed using a track system. For example, the track system can comprise a CLEAN TRACK ACT 8, ACT 12, or LITHIUS resist coating and developing system commercially available from Tokyo Electron Limited (TEL). Other systems and methods for forming a photo-resist film on a substrate are well known to those skilled in the art of spin-on resist technology.

The exposure to a pattern of electro-magnetic (EM) radiation may be performed in a dry or wet photo-lithography system. The image pattern can be formed using any suitable conventional stepping lithographic system, or scanning lithographic system. For example, the photo-lithographic system may be commercially available from ASML Netherlands B.V. (De Run 6501, 5504 DR Veldhoven, The Netherlands), or Canon USA, Inc., Semiconductor Equipment Division (3300 North First Street, San Jose, Calif. 95134).

The developing process can include exposing the substrate to a developing solution in a developing system, such as a track system. For example, the track system can comprise a CLEAN TRACK ACT 8, ACT 12, or LITHIUS resist coating and developing system commercially available from Tokyo Electron Limited (TEL).

The photo-resist layer may be removed using a wet stripping process, a dry plasma ashing process, or a dry non-plasma ashing process.

The mask layer 26 may include multiple layers, wherein the first pattern 27 formed in the mask layer 26 may be created using wet processing techniques, dry processing techniques, or a combination of both techniques. The formation of the mask layer 26 having a single layer or multiple layers is understood to those skilled in the art of lithography and pattern etching technology. Once the first pattern 27 is formed in mask layer 26, the mask layer 26 may be utilized to pattern underlying layers.

Figure 2C:
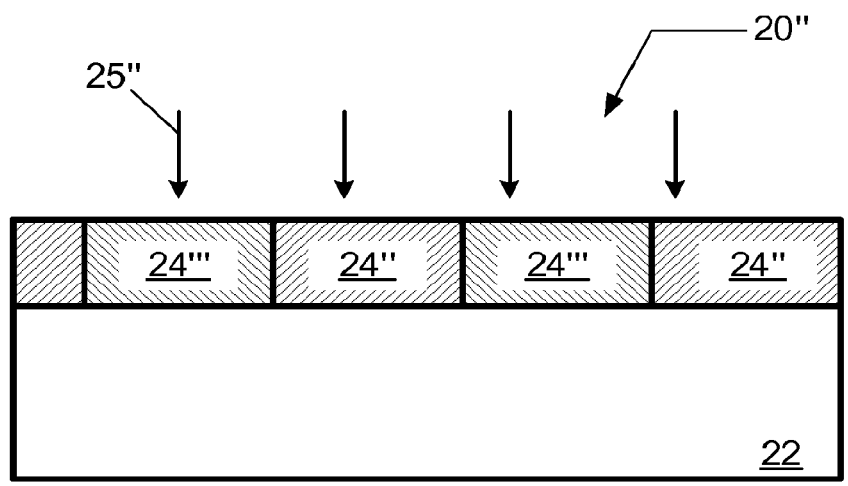

Alternatively yet, as illustrated in FIG. 2C, a first material layer 24" and a second material layer 24" overlying at least a portion 20" of substrate 22 may be etched using GCIB 25" to, for instance, planarize the first material layer 24" and the second material layer 24'. As an example, the first material may include first material layer 24" and the second material may include second material layer 24'. The surface exposing the first material and/or the second material may include the exposed surface of first material layer 24" and the exposed surface of second material layer 24'".

The method proceeds in 11 with holding substrate 22 securely within the reduced-pressure environment of the GCIB processing system. The temperature of substrate 22 may or may not be controlled. For example, substrate 22 may be heated or cooled during a GCIB treatment process. Additionally, the substrate 22 may include conductive materials, semi-conductive materials, or dielectric materials, or any combination of two or more thereof. For example, the substrate 22 may include a semiconductor material, such as silicon, silicon-on-insulator (SOI), germanium, or a combination thereof. Additionally, for example, the substrate 22 may include crystalline silicon.

Further, substrate 22 may include first and/or second material layer (24, 24', 24", 24', 26) on portion (20, 20', 20") of substrate 22. The first and/or second material layer (24, 24', 24", 24', 26) may include a Si-containing material and/or a Ge-containing material. The Si-containing material may include Si and at least one element selected from the group consisting of O, N, C, and Ge. The Ge-containing material may include Ge and at least one element selected from the group consisting of O, N, C, and Si.

For example, the first and/or second material layer (24, 24', 24", 24', 26) may include silicon, doped silicon, un-doped silicon, amorphous silicon, mono-crystalline silicon, poly-crystalline silicon, silicon oxide ($SiO_x$, where x>0; e.g., $SiO_2$), silicon nitride ($SiN_y$, wherein y>0; e.g., $SiN_{1.33}$, or $Si_3N_4$), silicon carbide ($SiC_z$, wherein z>0), silicon oxynitride ($SiO_xN_y$, where x,y>0), silicon oxycarbide ($SiO_xC_y$, where x,y>0), silicon carbonitride ($SiC_xN_y$, where x,y>0), or silicon-germanium ($Si_xGe_{1-x}$, where x is the atomic fraction of Si, 1−x is the atomic fraction of Ge, and 0<1−x<1). Any one of the materials listed above may be doped or infused with an element selected from the group consisting of B, C, H, N, P, As, Sb, O, S, Se, Te, F, Cl, Br, and I. Further, any one of the materials listed above may be doped or infused with a metal, an alkali metal, an alkaline earth metal, a rare earth metal, a transition metal, or a post-transition metal. Further yet, any one of the materials listed above may be in an amorphous phase or a crystalline phase.

Additionally, the first and/or second material layer (24, 24', 24", 24', 26) may include a metal-containing material. The metal-containing material may include an alkali metal, an alkaline earth metal, a transition metal, a post-transition metal, a noble metal, or a rare earth metal. The metal-containing material may include a transition or post-transition metal selected from the group consisting of Sc, Y, Zr, Hf, Nb, Ta, V, Cr, Mo, W, Mn, Re, Fe, Ru, Co, Rh, Ni, Pd, Pt, Cu, Ag, Au, Zn, Cd, B, Al, Ga, In, and Sn. The metal-containing material may include a metal, a metal alloy, a metal oxide, a metal nitride, a metal carbide, a metal silicide, a metal germanide, a metal sulfide, etc.

Furthermore, the first and/or second material layer (24, 24', 24", 24', 26) may also include a semiconductor material. The semiconductor material may include a compound semiconductor, such as a III-V compound (e.g., GaAs, GaN, GaP, InAs, InN, InP, etc.), a II-V compound (e.g., $Cd_3P_2$, etc.), or a II-VI compound (e.g., ZnO, ZnSe, ZnS, etc.) (Groups II, III, V, VI refer to the classical or old IUPAC notation in the Periodic Table of Elements; according to the revised or new IUPAC notation, these Groups would refer to Groups 2, 13, 15, 16, respectively). Material layer (24, 24') may also include a chalcogenide (e.g., sulfides, selenides, tellurides).

Further yet, the first and/or second material layer (24, 24', 24", 24', 26) may include a photo-resist (e.g., one of the resist materials listed above), a soft mask layer, a hard mask layer, an anti-reflective coating (ARC) layer, an organic planarization layer (OPL), or an organic dielectric layer (ODL), or a combination of two or more thereof.

In one example, the first material comprises photo-resist, and the second material comprises a Si-containing material, a Ge-containing material, a metal-containing material, a semiconductor material, or a chalcogenide material. In another example, the first material comprises silicon, and the second material comprises a Si-containing material having Si and one or more elements selected from the group consisting of O, N, C, and Ge. Silicon may include doped Si, un-doped Si, p-doped Si, n-doped Si, crystalline Si, amorphous Si, mono-crystalline Si (or single crystal Si), poly-crystalline Si, etc. In another example, the first material comprises a Si-containing material, and the second material comprises a Ge-containing material. In yet another example, the first material comprises a Si-containing material, and the second material comprises a metal-containing material.

In 12, one or more target etch process metrics are selected. As noted above and discussed in greater detail below, the target etch process metrics may include an etch rate of the first material, an etch rate of the second material, an etch selectivity between the first material and the second material, a surface roughness of the first material, a surface roughness of the second material, an etch profile of the first material, and an etch profile of the second material.

In 13, a gas cluster ion beam (GCIB) is formed from a pressurized gas mixture containing at least one etching gas. The at least one etching gas may include a halogen element. The at least one etching gas may include a halogen element and one or more elements selected from the group consisting of C, H, N, and S.

For example, the at least one etching gas may include $F_2$, $Cl_2$, $Br_2$, $NF_3$, or $SF_6$. Additionally, for example, the at least one etching gas may include a halide, such as HF, HCl, HBr, or HI. Furthermore, for example, the at least one etching gas may include a halomethane, such as a mono-substituted halomethane (e.g., $CH_3F$, $CH_3Cl$, $CH_3Br$, $CH_3I$), a di-substituted halomethane (e.g., $CH_2F_2$, $CH_2ClF$, $CH_2BrF$, $CH_2FI$, $CH_2Cl_2$, $CH_2BrCl$, $CH_2ClI$, $CH_2Br_2$, $CH_2BrI$, $CH_2I_2$), a tri-substituted halomethane (e.g., $CHF_3$, $CHClF_2$, $CHBrF_2$, $CHF_2I$, $CHCl_2F$, $CHBrClF$, $CHClFI$, $CHBr_2F$, $CHBrFI$, $CHFI_2$, $CHCl_3$, $CHBrCl_2$, $CHCl_2I$, $CHBr_2Cl$, $CHBrClI$, $CHClI_2$, $CHBr_3$, $CHBr_2I$, $CHBrI_2$, $CHI_3$), or a tetra-substituted halomethane (e.g., $CF_4$, $CClF_3$, $CBrF_3$, $CF_3I$, $CCl_2F_2$, $CBrClF_2$, $CClF_2I$, $CBr_2F_2$, $CBrF_2I$, $CF_2I_2$, $CCl_3F$, $CBrCl_2F$, $CCl_2FI$, $CBr_2ClF$, $CBrClFI$, $CClFI_2$, $CBr_3F$, $CBr_2FI$, $CBrFI_2$, $CFI_3$, $CBrCl_3$, $CCl_3I$, $CBr_2Cl_2$, $CBrCl_2I$, $CCl_2I_2$, $CBr_3Cl$, $CBr_2ClI$, $CBrClI_2$, $CClI_3$, $CBr_4$, $CBr_3I$, $CBr_2I_2$, $CBrI_3$, $CI_4$).

To form the GCIB, constituents of the etching gas should be selected that exist in a gaseous phase either alone or in combination with a carrier gas (e.g., a noble gas element or nitrogen) at relatively high pressure (e.g., a pressure of one atmosphere or greater).

In one embodiment, when etching a Si-containing and/or Ge-containing material, the at least one etching gas includes a halogen element selected from the group consisting of F, Cl, and Br. The at least one etching gas may further include C, or H, or both C and H. For example, the at least one etching gas may include a halide or a halomethane. Additionally, for example, the at least one etching gas may include $SF_6$, $NF_3$, $F_2$, $Cl_2$, $Br_2$, HF, HCl, HBr, $CClF_3$, $CBrF_3$, $CHClF_2$, or $C_2ClF_5$, or any combination of two or more thereof.

In another embodiment, when etching a Si-containing and/or Ge-containing material, the at least one etching gas includes two different halogen elements. A first halogen element may be selected from the group consisting of Cl and Br, and the second halogen element may include F. The at least one etching gas may further include C, or H, or both C and H. For example, the at least one etching gas may include a halomethane. Additionally, for example, the at least one etching gas may include $CClF_3$, $CBrF_3$, $CHClF_2$, or $C_2ClF_5$, or any combination of two or more thereof.

In another embodiment, when etching a Si-containing material having Si and one or more elements selected from the group consisting of O, C, N, and Ge, the at least one etching gas includes C, H, and a halogen element. For example, the etching gas may include a halomethane. Additionally, for example, the etching gas may include $CH_3F$, $CH_3Cl$, $CH_3Br$, $CHF_3$, $CHClF_2$, $CHBrF_2$, $CH_2F_2$, $CH_2ClF$, $CH_2BrF$, $CHCl_2F$, $CHBr_2F$, $CHCl_3$, $CHBrCl_2$, $CHBr_2Cl$, or $CHBr_3$, or any combination of two or more thereof.

In another embodiment, when etching a metal-containing material, the etching gas includes a halogen element selected from the group consisting of F, Cl, and Br. The etching gas may further include C, or H, or both C and H. For example, the etching gas may include a halide or a halomethane. Additionally, for example, the etching gas may include $SF_6$, $NF_3$, $F_2$, $Cl_2$, $Br_2$, HF, HCl, HBr, $CClF_3$, $CBrF_3$, $CHClF_2$, or $C_2ClF_5$, or any combination of two or more thereof.

In another embodiment, when etching a metal-containing material, the etching gas includes two different halogen elements. A first halogen element may be selected from the group consisting of Cl and Br, and the second halogen element may include F. The etching gas may further include C, or H, or both C and H. For example, the etching gas may include a halomethane. Additionally, for example, the etching gas may include $CClF_3$, $CBrF_3$, $CHClF_2$, or $C_2ClF_5$, or any combination of two or more thereof.

In yet another embodiment, when etching a chalcogenide material, the etching gas includes a halogen element. For example, the etching gas may include a halide or halomethane. Additionally, for example, the etching gas may include $F_2$, $Cl_2$, $Br_2$, HF, HCl, HBr, $NF_3$, $SF_6$, $CH_3F$, $CH_3Cl$, $CH_3Br$, $CHF_3$, $CHClF_2$, $CHBrF_2$, $CH_2F_2$, $CH_2ClF$, $CH_2BrF$, $CHCl_2F$, $CHBr_2F$, $CHCl_3$, $CHBrCl_2$, $CHBr_2Cl$, or $CHBr_3$, or any combination of two or more thereof.

The at least one etching gas may include a first etching gas and a second etching gas. In one embodiment, the first etching gas contains Cl or Br, and the second etching gas contains F. For example, the first etching gas may contain $Cl_2$, and the second etching gas may contain $NF_3$. In another embodiment, the first etching gas contains a halomethane or halide, and the second etching gas contains F, Cl, or Br. In another embodiment, the first etching gas contains C, H, and a halogen element, and the second etching gas contains F, Cl, or Br. For example, the first etching gas may contain $CHF_3$, $CHCl_3$, or $CHBr_3$, and the second etching gas may contain $NF_3$ or $Cl_2$. The first etching gas and the second etching gas may be continuously introduced to the GCIB. Alternatively, the first etching gas and the second etching gas may be alternatingly and sequentially introduced to the GCIB.

The pressurized gas mixture may further include a compound containing a halogen element; a compound containing F and C; a compound containing H and C; or a compound containing C, H, and F, or any combination of two or more thereof. Additionally, the pressurized gas mixture may further include a chlorine-containing compound, a fluorine-containing compound, or a bromine-containing compound. Additionally, the pressurized gas mixture may further include a compound containing one or more elements selected from the group consisting of C, F, H, Cl, and Br. Additionally yet, the pressurized gas mixture may further include a silicon-containing compound, a germanium-containing compound, a nitrogen-containing compound, an oxygen-containing compound, or a carbon-containing compound, or any combination of two or more thereof. Furthermore, the pressurized gas mixture may further include one or more elements selected from the group consisting of B, C, H, Si, Ge, N, P, As, O, S, F, Cl, and Br. Further yet, the pressurized gas mixture may further include He, Ne, Ar, Kr, Xe, $O_2$, CO, $CO_2$, $N_2$, NO, $NO_2$, $N_2O$, $NH_3$, $F_2$, HF, $SF_6$, or $NF_3$, or any combination of two or more thereof.

Even further yet, the GCIB may be generated from a pressurized gas mixture that includes at least one dopant, or film forming constituent for depositing or growing a thin film, or any combination of two or more thereof.

In another embodiment, the GCIB may be generated by alternatingly and sequentially using a first pressurized gas mixture containing an etch gas and a second pressurized gas mixture containing a film forming gas. In yet other embodiments, a composition and/or a stagnation pressure of the GCIB may be adjusted during the etching.

In 14, one or more GCIB properties of a GCIB process condition for the GCIB are set to achieve the one or more target etch process metrics. To achieve the target etch process metrics noted above, such as etch rate, etch selectivity, surface roughness control, profile control, etc., the GCIB may be generated by performing the following: selecting a beam acceleration potential, one or more beam focus potentials, and a beam dose; accelerating the GCIB according to the beam acceleration potential; focusing the GCIB to according to the one or more beam focus potentials; and irradiating the accelerated GCIB onto at least a portion of the substrate according to the beam dose.

Furthermore, in addition to these GCIB properties, a beam energy, a beam energy distribution, a beam angular distribution, a beam divergence angle, a stagnation pressure, a stagnation temperature, a mass flow rate, a cluster size, a cluster size distribution, a beam size, a beam composition, a beam electrode potential, or a gas nozzle design (such as nozzle throat diameter, nozzle length, and/or nozzle divergent section half-angle) may be selected. Any one or more of the aforementioned GCIB properties can be selected to achieve control of target etch process metrics, such as those noted above. Furthermore, any one or more of the aforementioned GCIB properties can be modified to achieve control of target etch process metrics, such as those noted above.

Figure 3A:
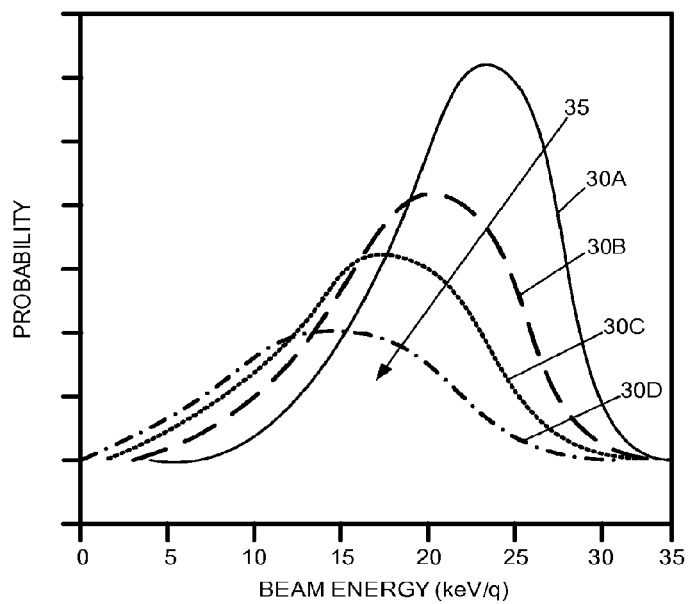
FIG. 3A provides a schematic graphical illustration of a beam energy distribution function for a GCIB.

In FIG. 3A, a schematic graphical illustration of a beam energy distribution function for a GCIB is illustrated. For example, FIG. 3A graphically illustrates several beam energy distributions (30A, 30B, 30C, 30D), wherein the peak beam energy decreases and the energy distribution broadens as one proceeds through the distributions in direction 35.

The beam energy distribution function for the GCIB may be modified by directing the respective GCIB along a GCIB path through an increased pressure region such that at least a portion of the GCIB traverses the increased pressure region. The extent of modification to the beam energy distribution may be characterized by a pressure-distance (d) integral along the at least a portion of the GCIB path. When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. As an example, one may broaden the beam energy distribution to increase the beam divergence, or one may narrow the beam energy distribution to decrease the beam divergence.

The pressure-distance integral along the at least a portion of the GCIB path may be equal to or greater than about 0.0001 torr-cm. Alternatively, the pressure-distance integral along the at least a portion of the GCIB path may be equal to or greater than about 0.001 torr-cm. Alternatively yet, the pressure-distance integral along the at least a portion of the GCIB path may be equal to or greater than about 0.01 torr-cm. As an example, the pressure-distance integral along the at least a portion of the GCIB path may range from 0.0001 torr-cm to 0.01 torr-cm. As another example, the pressure-distance integral along the at least a portion of the GCIB path may range from 0.001 torr-cm to 0.01 torr-cm.

Alternatively, the beam energy distribution function for the GCIB may be modified by modifying or altering a charge state of the respective GCIB. For example, the charge state may be modified by adjusting an electron flux, an electron energy, or an electron energy distribution for electrons utilized in electron collision-induced ionization of gas clusters.

Figure 3B:
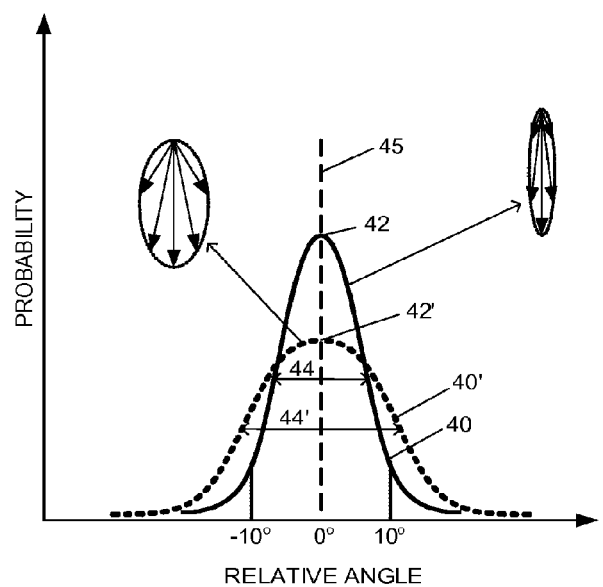
FIG. 3B provides a schematic graphical illustration of a beam angular distribution function for a GCIB.

In FIG. 3B, a schematic graphical illustration of a beam angular distribution function for a GCIB is illustrated. For example, FIG. 3B graphically illustrates a first beam angular distribution function 40 characterized by a first peak 42 at a direction of incidence 45 (i.e., relative angle is 0°) and a first width 44 (e.g., a full-width at half maximum (FWHM)). Additionally, for example, FIG. 3B illustrates a second beam angular distribution function 40' characterized by a second peak 42' at the direction of incidence 45 (i.e., relative angle is) 0° and a second width 44' (e.g., a full-width at half maximum (FWHM)). The first beam angular distribution function 40 represents a narrow distribution (or a relatively narrower beam divergence angle), while the second beam angular distribution function 40' represents a relatively broader distribution (or a relatively broader beam divergence angle). Hence, the directionality of the GCIB relative to normal incidence on the substrate may be adjusted by altering the beam angular distribution function (e.g., changing the angular distribution between the first beam angular distribution function 40 and the second beam angular distribution function 40'). The beam angular distribution function or beam divergence angle may be modified using the aforementioned techniques described for modifying the beam energy distribution function.

In one embodiment, the one or more GCIB properties of the GCIB process condition may include a GCIB composition, a beam dose, a beam acceleration potential, a beam focus potential, a beam energy, a beam energy distribution, a beam angular distribution, a beam divergence angle, a flow rate of said GCIB composition, a stagnation pressure, a stagnation temperature, a background gas pressure for an increased pressure region through which said GCIB passes, or a background gas flow rate for an increased pressure region through which said GCIB passes (e.g., a P-Cell value, as will be discussed in greater detail below).

In another embodiment, the setting of the one or more GCIB properties to achieve the one or more target etch process metrics may include setting a GCIB composition, a beam acceleration potential, a flow rate of the GCIB composition, and a background gas flow rate for an increased pressure region through which the GCIB passes to achieve two or more of a target etch rate for the first material and/or the second material, a target etch selectivity between the first material and the second material, and a target surface roughness for the first material and/or the second material.

As will be shown below, the one or more GCIB properties may be adjusted to alter the target etch selectivity between the first and second materials to values less than unity, substantially near unity, and above unity. Furthermore, as will be shown below, the one or more GCIB properties may be adjusted to alter the target surface roughness for the first material and/or the second material to values less than or equal to 5 Angstrom. Further yet, the one or more GCIB properties may be adjusted to achieve a relatively high etch rate condition for the first and/or second materials, or achieve a relatively low etch rate condition for the first and/or second materials.

In 15, the GCIB is accelerated through the reduced pressure environment towards substrate 22 according to a beam acceleration potential. For the GCIB, the beam acceleration potential may range up to 100 kV, the beam energy may range up to 100 keV, the cluster size may range up to several tens of thousands of atoms, and the beam dose may range up to about $1 \times 10^{17}$ clusters per cm$^2$. For example, the beam acceleration potential of the GCIB may range from about 1 kV to about 70 kV (i.e., the beam energy may range from about 1keV to about 70 keV, assuming an average cluster charge state of unity). Additionally, for example, the beam dose of the GCIB may range from about $1 \times 10^{12}$ clusters per cm$^2$ to about $1 \times 10^{14}$ clusters per cm$^2$.

The GCIB may be established having an energy per atom ratio ranging from about 0.25 eV per atom to about 100 eV per atom. Alternatively, the GCIB may be established having an energy per atom ratio ranging from about 0.25 eV per atom to about 10 eV per atom. Alternatively, the GCIB may be established having an energy per atom ratio ranging from about 1 eV per atom to about 10 eV per atom.

The establishment of the GCIB having a desired energy per atom ratio may include selection of a beam acceleration potential, a stagnation pressure for formation of the GCIB, or a gas flow rate, or any combination thereof. The beam acceleration potential may be used to increase or decrease the beam energy or energy per ion cluster. For example, an increase in the beam acceleration potential causes an increase in the maximum beam energy and, consequently, an increase in the energy per atom ratio for a given cluster size. Additionally, the stagnation pressure may be used to increase or decrease the cluster size for a given cluster. For example, an increase in the stagnation pressure during formation of the GCIB causes an increase in the cluster size (i.e., number of atoms per cluster) and, consequently, a decrease in the energy per atom ratio for a given beam acceleration potential.

Herein, beam dose is given the units of number of clusters per unit area. However, beam dose may also include beam current and/or time (e.g., GCIB dwell time). For example, the beam current may be measured and maintained constant, while time is varied to change the beam dose. Alternatively, for example, the rate at which clusters strike the surface of the substrate per unit area (i.e., number of clusters per unit area per unit time) may be held constant while the time is varied to change the beam dose.

In 16, the GCIB is irradiated onto at least a portion of the surface of substrate 22 to etch at least one of the first material and the second material on substrate 22.

The method described in FIG. 1 may further include altering the one or more target etch process metrics to create one or more new target etch process metrics, and setting one or more additional GCIB properties of an additional GCIB process condition for the GCIB to achieve the one or more new target etch process metrics.

According to another embodiment, in addition to irradiation of substrate 22 with the GCIB, another GCIB may be used for additional control and/or function. Irradiation of the substrate 22 by another GCIB, such as a second GCIB, may proceed before, during, or after use of the GCIB. For example, another GCIB may be used to dope a portion of the substrate 22 with an impurity. Additionally, for example, another GCIB may be used to modify a portion of the substrate 22 to alter properties of substrate 22. Additionally, for example, another GCIB may be used to etch a portion of the substrate 22 to remove additional material from substrate 22. Additionally, for example, another GCIB may be used to clean a portion of the substrate 22 to remove additional material or residue, such as halogen-containing residue, from substrate 22. Additionally yet, for example, another GCIB may be used to grow or deposit material on a portion of the substrate 22. The doping, modifying, etching, cleaning, growing, or depositing may comprise introducing one or more elements selected from the group consisting of He, Ne, Ar, Xe, Kr, B, C, Se, Te, Si, Ge, N, P, As, O, S, F, Cl, and Br.

According to another embodiment, the at least one portion (20, 20', 20") of substrate 22 subjected to GCIB irradiation may be cleaned before or after the irradiating with the GCIB. For example, the cleaning process may include a dry cleaning process and/or a wet cleaning process. Additionally, the at least one portion (20, 20', 20") of substrate 22 subjected to GCIB irradiation may be annealed after the irradiating with the GCIB.

According to another embodiment, when preparing and/or etching substrate 22, any portion of substrate 22 or the feature pattern 28 may be subjected to corrective processing. During corrective processing, metrology data may be acquired using a metrology system coupled to a GCIB processing system, either in-situ or ex-situ. The metrology system may comprise any variety of substrate diagnostic systems including, but not limited to, optical diagnostic systems, X-ray fluorescence spectroscopy systems, four-point probing systems, transmission-electron microscope (TEM), atomic force microscope (AFM), scanning-electron microscope (SEM), etc. Additionally, the metrology system may comprise an optical digital profilometer (ODP), a scatterometer, an ellipsometer, a reflectometer, an interferometer, or any combination of two or more thereof.

For example, the metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035). Additionally, for example, the in-situ metrology system may include an integrated Optical Digital Profilometry (iODP) scatterometry module configured to measure metrology data on a substrate.

The metrology data may include parametric data, such as geometrical, mechanical, electrical and/or optical parameters associated with the substrate, any layer or sub-layer formed on the substrate, and/or any portion of a device on the substrate. For example, metrology data can include any parameter measurable by the metrology systems described above. Additionally, for example, metrology data can include a film thickness, a surface and/or interfacial roughness, a surface contamination, a feature depth, a trench depth, a via depth, a feature width, a trench width, a via width, a critical dimension (CD), an electrical resistance, or any combination of two or more thereof.

The metrology data may be measured at two or more locations on the substrate. Moreover, this data may be acquired and collected for one or more substrates. The one or more substrates may, for instance, include a cassette of substrates. The metrology data is measured at two or more locations on at least one of the one or more substrates and may, for example, be acquired at a plurality of locations on each of the one or more substrates. Thereafter, the plurality of locations on each of the plurality of substrates can be expanded from measured sites to unmeasured sites using a data fitting algorithm. For example, the data fitting algorithm can include interpolation (linear or nonlinear) or extrapolation (linear or nonlinear) or a combination thereof.

Once metrology data is collected for the one or more substrates using the metrology system, the metrology data is provided to a controller for computing correction data. Metrology data may be communicated between the metrology system and the controller via a physical connection (e.g., a cable), or a wireless connection, or a combination thereof. Additionally, the metrology data may be communicated via an intranet or Internet connection. Alternatively, metrology data may be communicated between the metrology system and the controller via a computer readable medium.

Correction data may be computed for location specific processing of the substrate. The correction data for a given substrate comprises a process condition for modulation of the GCIB dose as a function of position on the substrate in order to achieve a change between the parametric data associated with the incoming metrology data and the target parametric data for the given substrate. For example, the correction data for a given substrate can comprise determining a process condition for using the GCIB to correct a non-uniformity of the parametric data for the given substrate. Alternatively, for example, the correction data for a given substrate can comprise determining a process condition for using the GCIB to create a specifically intended non-uniformity of the parametric data for the given substrate.

Using an established relationship between the desired change in parametric data and the GCIB dose and an established relationship between the GCIB dose and a GCIB process condition having a set of GCIB processing parameters, the controller determines correction data for each substrate. For example, a mathematical algorithm can be employed to take the parametric data associated with the incoming metrology data, compute a difference between the incoming parametric data and the target parametric data, invert the GCIB processing pattern (i.e., etching pattern or deposition pattern or both) to fit this difference, and create a beam dose contour to achieve the GCIB processing pattern using the relationship between the change in parametric data and the GCIB dose. Thereafter, for example, GCIB processing parameters can be determined to affect the calculated beam dose contour using the relationship between the beam dose and the GCIB process condition. The GCIB processing parameters can include a beam dose, a beam area, a beam profile, a beam intensity, a beam scanning rate, or an exposure time (or beam dwell time), or any combination of two or more thereof.

Many different approaches to the selection of mathematical algorithm may be successfully employed in this embodiment. In another embodiment, the beam dose contour may selectively deposit additional material in order to achieve the desired change in parametric data.

The correction data may be applied to the substrate using a GCIB. During corrective processing, the GCIB may be configured to perform at least one of smoothing, amorphizing, modifying, doping, etching, growing, or depositing, or any combination of two or more thereof. The application of the corrective data to the substrate may facilitate correction of substrate defects, correction of substrate surface planarity, correction of layer thickness, or improvement of layer adhesion. Once processed to GCIB specifications, the uniformity of the substrate(s) or distribution of the parametric data for the substrate(s) may be examined either in-situ or ex-situ, and the process may be finished or refined as appropriate.

TABLE 1

| GCIB Process Condition | GCIB Composition | Beam Acceleration Potential (kV) | P-Cell |
|---|---|---|---|
| A | Ar | 30 | 0 |
| B | 5% $NF_3/N_2$ | 30 | 0 |
| C | 5% $NF_3/N_2$ | 60 | 0 |
| D | 20% $CHF_3$/He | 60 | 0 |
| E | 20% $CHF_3$/He + $O_2$ | 60 | 0 |
| F | 10% $C_2F_6$/He | 60 | 0 |
| G | 10% $C_2HF_5$/He | 60 | 0 |
| H | 20% $CF_4$/He | 60 | 0 |
| I | 4% $Cl_2$/He | 30 | 0 |
| J | 4% $Cl_2$/He | 60 | 40 |
| K | 4% $Cl_2$/He + $O_2$ | 60 | 40 |
| L | 4% $Cl_2$/He + $O_2$ | 60 | 0 |

Figure 4A:
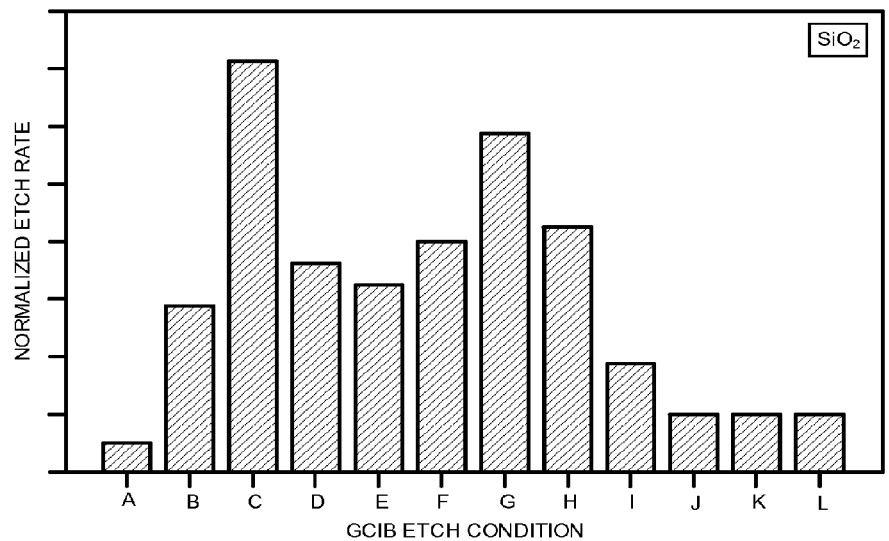
FIGS. 4A through 4L graphically depict exemplary data for etching material on a substrate.

Turning now to FIGS. 4A through 4L, exemplary data for etching material on a substrate is graphically depicted. FIG. 4A is a bar graph of a normalized etch rate of silicon dioxide ($SiO_2$) as a function of twelve (12) GCIB process conditions. The GCIB process conditions for the twelve (12) GCIB etch processes are provided in Table 1. The etch rate for each GCIB process condition is normalized by the etch rate using an Ar GCIB, which is listed as GCIB process condition "A" in Table 1.

In Table 1, each GCIB process condition provides a GCIB composition, a beam acceleration potential (kV), and a P-Cell value that relates to modification of the beam energy distribution function. Concerning the GCIB composition, the notation "5% $NF_3/N_2$" represents the relative amount (mol/mol %) of $NF_3$ in $N_2$. Concerning the P-Cell value, as described above, the P-Cell value is related to a flow rate (in sccm, standard cubic centimeters per minute) of a background gas introduced to an increased pressure region to cause collisions between the GCIB and the background gas and, thus, broadening of the beam energy distribution function. For example, the pressure in the pressure cell, through which the GCIB traverses, is raised by introducing a background gas at a flow rate of 40 sccm (P-Cell value of "40") (or a pressure-distance integral of about 0.005 torr-cm) to the pressure cell.

As illustrated in FIG. 4A, the etch rate of silicon dioxide ($SiO_2$) was determined for a wide range of GCIB process conditions. When the GCIB contains only Ar, as in GCIB process condition "A", the etch rate is driven by a purely physical component, e.g., sputtering. However, FIG. 4A and Table 1 suggest that the GCIB composition may be selected to provide a chemical component to the etch process, and an increase in the etch rate.

Figure 4B:
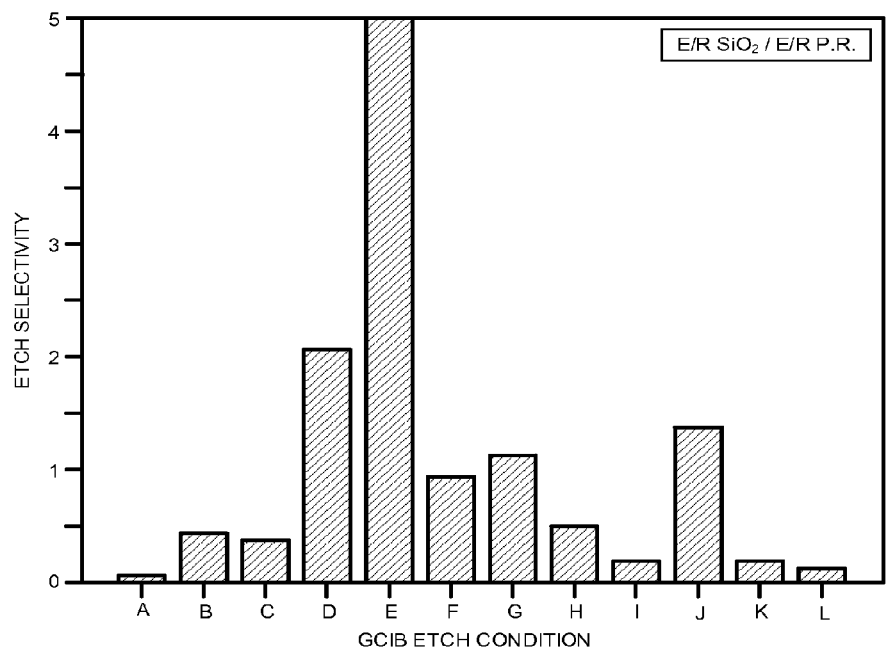

As shown in FIG. 4B, a bar graph charts the etch selectivity between silicon dioxide ($SiO_2$) and photo-resist as a function of the GCIB process conditions in Table 1. The etch selectivity relates the etch rate of silicon dioxide ($SiO_2$) to the etch rate of photo-resist (P.R.) (i.e., E/R $SiO_2$/E/R P.R.). Inspection of FIG. 4B indicates that a $CHF_3$-based GCIB composition and a $Cl_2$-based GCIB composition provide an etch selectivity in excess of unity.

Figure 4C:
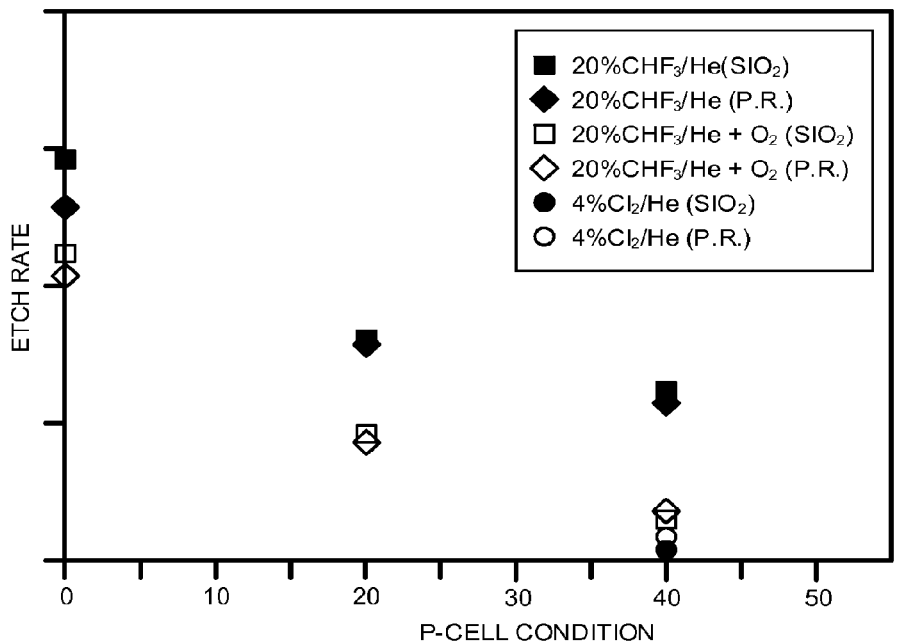

FIG. 4C is a data graph of etch rate of silicon dioxide ($SiO_2$) and photo-resist (P.R.) as a function of GCIB process condition and P-Cell value. The GCIB process conditions for three (3) GCIB etch processes are provided in Table 2. In Table 2, each GCIB process condition provides a GCIB composition, a beam acceleration potential (kV), and a flow rate (sccm) for each chemical component in the respective GCIB composition. As evident from FIG. 4C, the etch rate for both silicon dioxide and photo-resist using any of the three GCIB process conditions decreases as the P-Cell value is increased.

TABLE 2

| GCIB Composition | Beam Acceleration Potential (kV) | $CHF_3$/He Flow Rate (sccm) | $O_2$ Flow Rate (sccm) | $Cl_2$/He Flow Rate (sccm) |
|---|---|---|---|---|
| 20% $CHF_3$/He | 60 | 400 | 0 | 0 |
| 20% $CHF_3$/He + $O_2$ | 60 | 100 | 300 | 0 |
| 4% $Cl_2$/He | 60 | 0 | 0 | 550 |

Figure 4D:
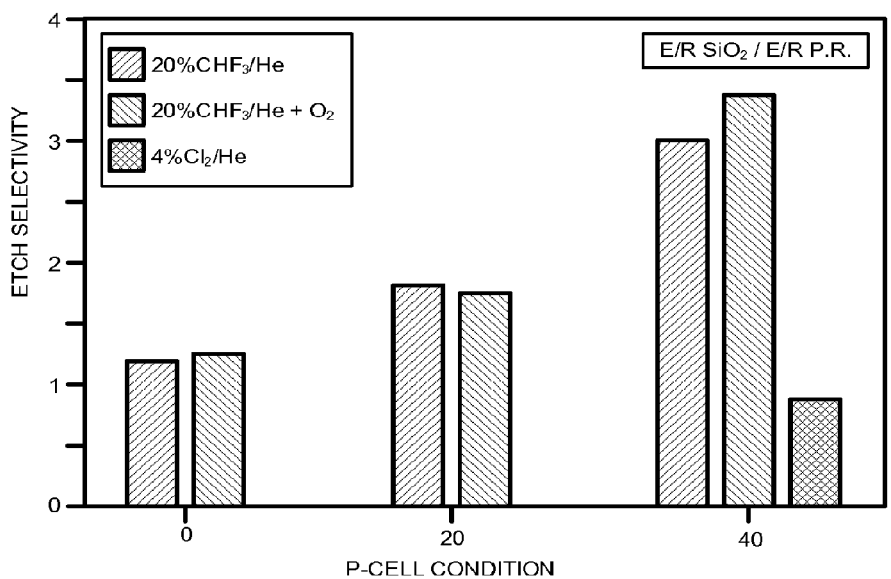

As shown in FIG. 4D, a bar graph charts the etch selectivity between silicon dioxide ($SiO_2$) and photo-resist as a function of the GCIB process conditions in Table 2. The etch selectivity relates the etch rate of silicon dioxide ($SiO_2$) to the etch rate of photo-resist (P.R.) (i.e., E/R $SiO_2$/E/R P.R.). Inspection of FIG. 4D indicates the following: (1) Etch selectivity between $SiO_2$ and P.R. increases with increasing P-Cell value; (2) Etch selectivity between $SiO_2$ and P.R. may slightly increase with oxygen addition in a halomethane composition, particularly at higher P-Cell value; and (3) $CHF_3$-based GCIB composition provides high etch selectivity between $SiO_2$ and P.R. than $Cl_2$-based GCIB composition.

Figure 4E:
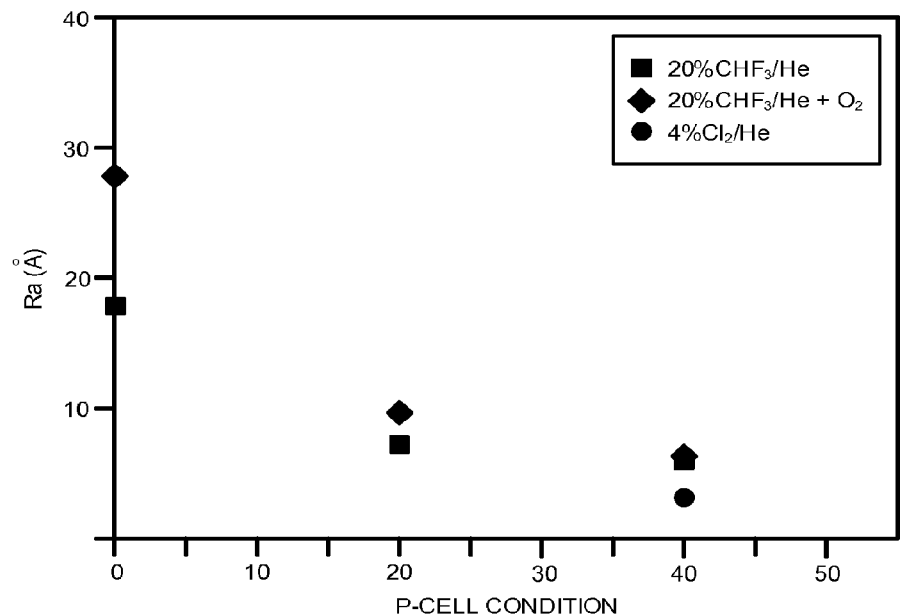

As shown in FIG. 4E, a data graph of the surface roughness of the etch surface in silicon dioxide ($SiO_2$) is plotted as a function of the GCIB process condition in Table 2 and P-Cell value. The surface roughness ($R_a$, measured in Angstrom, A) represents an average roughness. The degree of roughness may be a measure of the interfacial and/or surface unevenness. For example, the degree of roughness, such as surface roughness, may be characterized mathematically as a maximum roughness ($R_{max}$), an average roughness ($R_a$) (as shown in FIG. 4E), or a root-mean-square (rms) roughness ($R_q$). Inspection of FIG. 4E indicates the following: (1) Average roughness of $SiO_2$ surface decreases with increasing P-Cell value; and (2) $CHF_3$-based GCIB composition provides a slightly higher average roughness on $SiO_2$ than $Cl_2$-based GCIB composition.

Figure 4F:
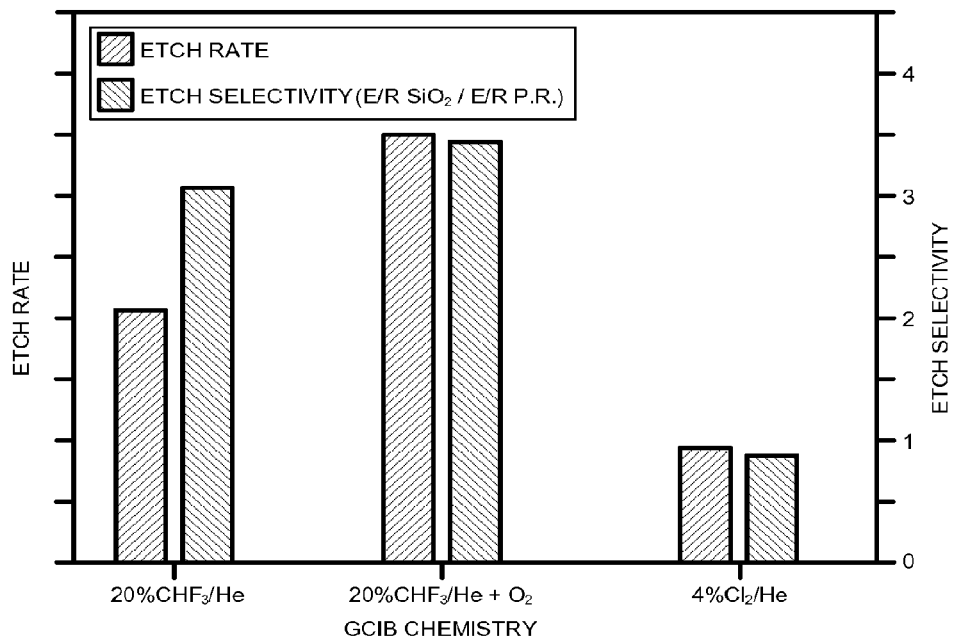

As shown in FIG. 4F, a bar graph charts the etch rate of silicon dioxide ($SiO_2$) and the etch selectivity between silicon dioxide ($SiO_2$) and photo-resist as a function of the GCIB process conditions in Table 3. The etch selectivity relates the etch rate of silicon dioxide (SiO$_2$) to the etch rate of photo-resist (P.R.) (i.e., E/R SiO$_2$/E/R P.R.). The GCIB compositions for the three (3) GCIB process conditions in Table 3 are the same as in Table 2; however, some GCIB process conditions are adjusted to achieve relatively low surface roughness (of order magnitude of 3 Angstrom or less).

TABLE 3

| GCIB Composition | Beam Acceleration Potential (kV) | P-Cell Value | CHF$_3$/He Flow Rate (sccm) | O$_2$ Flow Rate (sccm) | Cl$_2$/He Flow Rate (sccm) | Etch Selectivity (SiO$_2$/P.R.) | Average Roughness (A) |
|---|---|---|---|---|---|---|---|
| 20% CHF$_3$/He | 60 | 40 | 300 | 0 | 0 | 3.3 | 3.0 |
| 20% CHF$_3$/He + O$_2$ | 60 | 40 | 75 | 225 | 0 | 3.0 | 3.6 |
| 4% Cl$_2$/He | 60 | 40 | 0 | 0 | 550 | 0.8 | 3.3 |

Table 3 provides the beam acceleration potential, the P-Cell value, the flow rates of each pressurized gas in the GCIB composition, and the resultant etch selectivity and average roughness. FIG. 4F displays the corresponding relative etch rate and etch selectivity. Clearly, the CHF$_3$-based GCIB composition achieves relatively low surface roughness with relatively high etch selectivity.

Figure 4G:
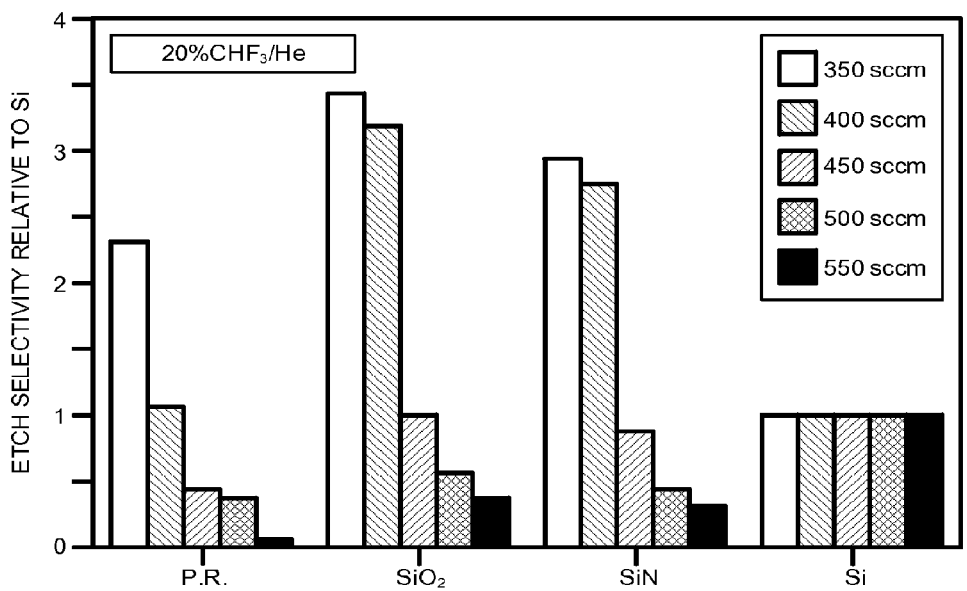

FIG. 4G is a bar graph of the etch selectivity for photo-resist (P.R.), silicon dioxide (SiO$_2$), and silicon nitride (SiN) relative to poly-crystalline silicon (Si) as a function of flow rate for a GCIB composition of 20% CHF$_3$/He. The GCIB process condition further includes a beam acceleration potential of 60kV and a P-Cell value of 0. As the flow rate is increased from 350 sccm to 550 sccm, the etch selectivity for P.R., SiO$_2$, and SiN relative to Si decays from a value above unity to a value below unity.

Figure 4H:
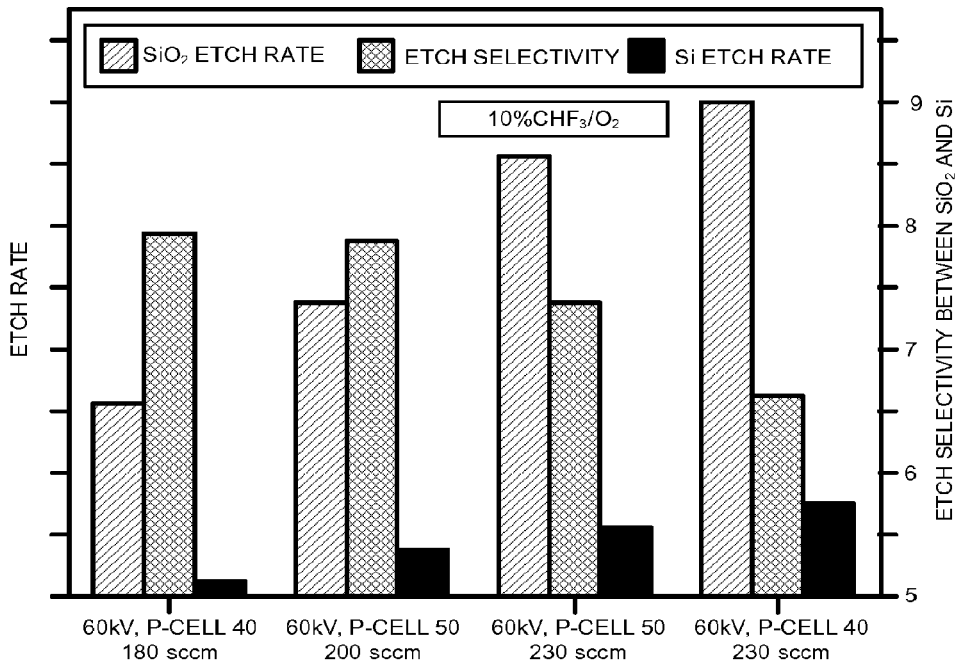

FIG. 4H is a bar graph of the etch selectivity between silicon dioxide (SiO$_2$) and poly-crystalline silicon (Si) as a function of GCIB process condition for a GCIB composition of 10% CHF$_3$/He. As shown in FIG. 4H, an increase in P-Cell value increases the etch selectivity between SiO$_2$ and Si, while an increase in flow rate decreases the etch selectivity between SiO$_2$ and Si.

In Table 4, several GCIB process conditions, and the resultant etch selectivity (between SiO$_2$ and Si) and average roughness are provided. The etch selectivity may be varied from a value of about 1 to about 12, while achieving an average roughness ranging from about 1 A to about 4 A, by adjusting various GCIB process conditions, including GCIB composition, beam acceleration potential, P-Cell value, and flow rate.

Figure 4I:
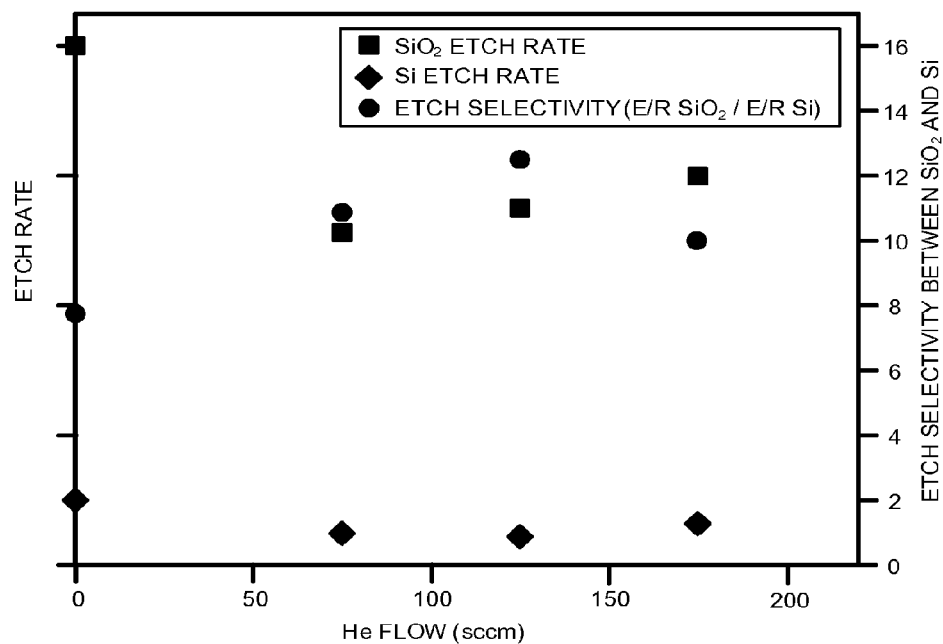

FIG. 4I is a data graph of the etch rate of SiO$_2$, the etch rate of poly-crystalline silicon (Si), and the etch selectivity between SiO$_2$ and Si as a function of the flow rate of He added to a GCIB composition of 10% CHF$_3$/O$_2$. The GCIB process condition for the peak value of etch selectivity (about 12.2) is provided in Table 4 (see row 6). While varying the He flow rate, the remaining parameters in the GCIB process condition were held constant.

Figure 4J:
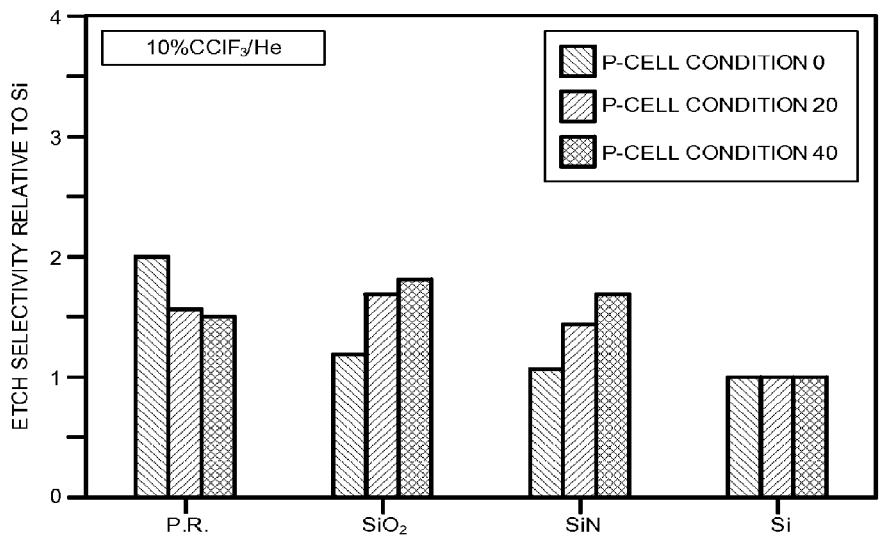

FIG. 4J is a bar graph of the etch selectivity for photo-resist (P.R.), silicon dioxide (SiO$_2$), and silicon nitride (SiN) relative to poly-crystalline silicon (Si) as a function of P-Cell value for a GCIB composition of 10% CClF$_3$/He. The GCIB process condition further includes a beam acceleration potential of 60kV and a flow rate of 450 sccm. As the P-Cell value is increased from 0 to 40, the etch selectivity for SiO$_2$ and SiN relative to Si increases, while the etch selectivity for P.R. relative to Si decreases.

TABLE 4

| GCIB Composition | Beam Acceleration Potential (kV) | P-Cell Value | CHF$_3$/He Flow Rate (sccm) | CHF$_3$/O$_2$ Flow Rate (sccm) | O$_2$ Flow Rate (sccm) | He Flow Rate (sccm) | CHClF$_2$/He Flow Rate (sccm) | Etch Selectivity (SiO$_2$/Si) | Average Roughness (A) |
|---|---|---|---|---|---|---|---|---|---|
| 20% CHF$_3$/He | 60 | 40 | 350 | 0 | 0 | 0 | 0 | 6.4 | 2.5 |
| 20% CHF$_3$/He + O$_2$ | 60 | 40 | 125 | 0 | 125 | 0 | 0 | 7.2 | 2.2 |
| 4% CHClF$_2$/He | 60 | 40 | 0 | 0 | 0 | 0 | 680 | 9.1 | 4.0 |
| 10% CHF$_3$/O$_2$ | 60 | 50 | 0 | 200 | 0 | 0 | 0 | 7.9 | 1.3 |
| 10% CHF$_3$/O$_2$ | 60 | 40 | 0 | 230 | 0 | 0 | 0 | 6.6 | 2.7 |
| 10% CHF$_3$/O$_2$ + He | 60 | 40 | 0 | 180 | 0 | 125 | 0 | 12.2 | 1.1 |
| 10% CHF$_3$/O$_2$ | 30 | 40 | 0 | 300 | 0 | 0 | 0 | 3.7 | 8.4 |
| 20% CHF$_3$/He | 30 | 40 | 475 | 0 | 0 | 0 | 0 | 1.1 | 3.9 |

TABLE 5

| GCIB Composition | Beam Acceleration Potential (kV) | P-Cell Value | CBrF$_3$/He Flow Rate (sccm) | N$_2$ Flow Rate (sccm) | Etch Selectivity (Si/SiO$_2$) | Average Roughness-Si (A) |
|---|---|---|---|---|---|---|
| 10% CBrF$_3$/He | 30 | 40 | 400 | | 2.5 | 22.0 |
| 10% CBrF$_3$/He | 30 | 0 | 351 | | 2.3 | 19.1 |
| 10% CBrF$_3$/He | 45 | 40 | 400 | | 1.8 | 27.0 |
| 10% CBrF$_3$/He | 60 | 40 | 400 | | 1.4 | 28.0 |
| 10% CBrF$_3$/He | 30 | 40 | 351 | | 1.3 | 13.8 |
| 10% CBrF$_3$/He | 30 | 40 | 350 | | 0.9 | 18.0 |
| 10% CBrF$_3$/He | 30 | 40 | 400 | | 0.7 | 16.0 |
| 10% CBrF$_3$/He | 60 | 20 | 350 | | 0.6 | 8.7 |
| 10% CBrF$_3$/He | 60 | 40 | 350 | | 0.5 | 6.7 |
| 10% CBrF$_3$/He | 60 | 40 | 151 | 350 | 0.5 | 6.7 |
| 10% CBrF$_3$/He | 60 | 20 | 151 | 150 | 0.5 | 5.0 |
| 10% CBrF$_3$/He | 60 | 40 | 175 | 175 | 0.5 | 3.7 |
| 10% CBrF$_3$/He | 45 | 40 | 151 | 150 | 0.4 | 4.6 |
| 10% CBrF$_3$/He | 60 | 40 | 151 | 250 | 0.4 | 4.6 |
| 10% CBrF$_3$/He | 60 | 40 | 400 | | 0.4 | 3.8 |
| 10% CBrF$_3$/He | 60 | 40 | 150 | 150 | 0.4 | 3 |
| 10% CBrF$_3$/He | 60 | 40 | 350 | | 0.3 | |

Figure 4K:
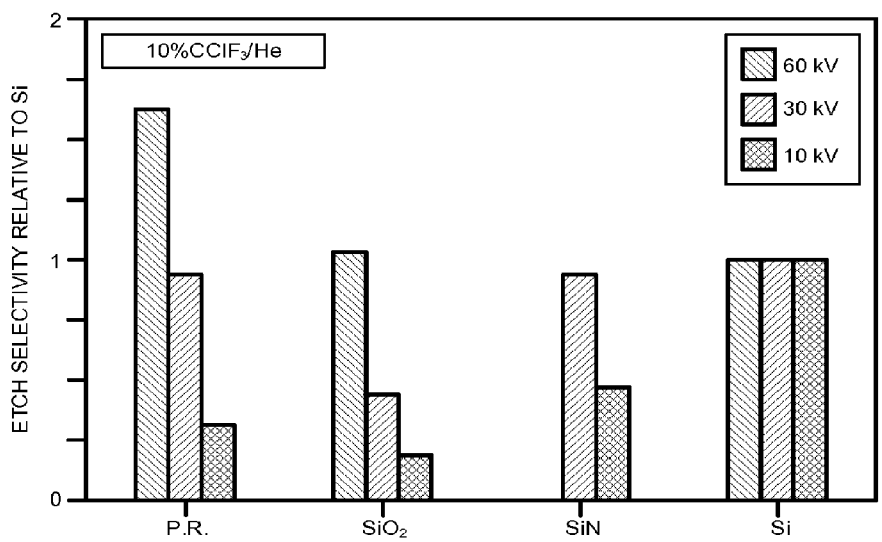

FIG. 4K is a bar graph of the etch selectivity for photoresist (P.R.), silicon dioxide (SiO$_2$), and silicon nitride (SiN) relative to poly-crystalline silicon (Si) as a function of beam acceleration potential for a GCIB composition of 10% CClF$_3$/He. The GCIB process condition further includes a P-Cell value of 0 and a flow rate of 450 sccm. As the beam acceleration potential is decreased from 60kV to 10kV, the etch selectivity for P.R., SiO$_2$, and SiN relative to Si decreases.

In Table 5, several GCIB process conditions, and the resultant etch selectivity (between Si and SiO$_2$) and average roughness in Si are provided. Each GCIB process condition recites a GCIB composition containing 10% CBrF$_3$ in He. In some cases, N$_2$ is added to the GCIB. The etch selectivity may be varied from a value of about 0.3 to about 2.5, while achieving an average roughness ranging from about 3 A to about 30 A, by adjusting various GCIB process conditions, including GCIB composition, beam acceleration potential, P-Cell value, and flow rate. For example, N$_2$ addition coupled with increased beam acceleration potential, increased P-Cell value, and decreased flow rate of the etch compound produces the least average roughness.

TABLE 6

| GCIB Composition | Beam Acceleration Potential (kV) | P-Cell Value | CF$_4$/He Flow Rate (sccm) | Additive Flow Rate (sccm) | Etch Selectivity (Si/SiO$_2$) | Average Roughness-Si (A) |
|---|---|---|---|---|---|---|
| 20% CF$_4$/He | 30 | 0 | 451 | | 0.54 | 14.1 |
| 20% CF$_4$/He | 60 | 40 | 550 | | 0.48 | 5.1 |
| 20% CF$_4$/He | 60 | 0 | 451 | | 0.47 | 18.6 |
| 20% CF$_4$/He | 60 | 40 | 451 | | 0.32 | 2.4 |

TABLE 7

| GCIB Composition | Beam Acceleration Potential (kV) | P-Cell Value | NF$_3$/N$_2$ Flow Rate (sccm) | Etch Selectivity (Si/SiN) | Etch Selectivity (p-Si/SiN) | Average Roughness-Si (A) |
|---|---|---|---|---|---|---|
| 20% NF$_3$/N$_2$ | 30 | 10 | 500 | 3.8 | | 31 |
| 20% NF$_3$/N$_2$ | 30 | 40 | 500 | 3.8 | | 20 |
| 20% NF$_3$/N$_2$ | 60 | 10 | 750 | 3.5 | | 60 |
| 20% NF$_3$/N$_2$ | 30 | 50 | 450 | 3.2 | 3.4 | 16 |
| 20% NF$_3$/N$_2$ | 60 | 10 | 500 | 2.7 | | 33 |
| 20% NF$_3$/N$_2$ | 60 | 10 | 500 | 2.4 | | 35 |
| 20% NF$_3$/N$_2$ | 45 | 10 | 400 | 2.3 | 2.3 | 30 |
| 20% NF$_3$/N$_2$ | 45 | 10 | 350 | 1.8 | 1.9 | 22 |
| 20% NF$_3$/N$_2$ | 45 | 50 | 450 | 1.7 | 1.8 | 15 |
| 20% NF$_3$/N$_2$ | 45 | 30 | 350 | 1.5 | 1.6 | 15 |
| 20% NF$_3$/N$_2$ | 30 | 40 | 350 | 1.5 | | 11 |
| 20% NF$_3$/N$_2$ | 45 | 30 | 400 | 1.4 | 1.5 | 17 |
| 20% NF$_3$/N$_2$ | 60 | 10 | 500 | 1.4 | | 26 |
| 20% NF$_3$/N$_2$ | 60 | 50 | 500 | 1.3 | | 17 |
| 20% NF$_3$/N$_2$ | 60 | 10 | 500 | 1.3 | | 24 |
| 20% NF$_3$/N$_2$ | 45 | 40 | 350 | 1.2 | | 10 |
| 20% NF$_3$/N$_2$ | 45 | 50 | 350 | 1.2 | 1.3 | 8 |
| 20% NF$_3$/N$_2$ | 45 | 50 | 400 | 1.1 | 1.4 | 10 |
| 20% NF$_3$/N$_2$ | 60 | 10 | 250 | 1.1 | | 11 |
| 20% NF$_3$/N$_2$ | 60 | 40 | 250 | 0.9 | | 2 |
| 20% NF$_3$/N$_2$ | 60 | 40 | 250 | 0.9 | | 3 |

In Table 6, several GCIB process conditions, and the resultant etch selectivity (between Si and SiO$_2$) and average roughness in Si are provided. Each GCIB process condition recites a GCIB composition containing 20% CF$_4$ in He. The etch selectivity may be varied from a value of about 0.32 to about 0.54, while achieving an average roughness ranging from about 2 Å to about 19 Å, by adjusting various GCIB process conditions, including GCIB composition, beam acceleration potential, P-Cell value, and flow rate.

In Table 7, several GCIB process conditions, and the resultant etch selectivity (between Si and SiN) and average roughness in Si are provided. Each GCIB process condition recites a GCIB composition containing 20% NF$_3$ in N$_2$. The etch selectivity may be varied from a value of about 1 to about 4, while achieving an average roughness ranging from about 2 Å to about 60 Å, by adjusting various GCIB process conditions, including GCIB composition, beam acceleration potential, P-Cell value, and flow rate. A high etch rate and etch selectivity may be achieved at the expense of average roughness. Furthermore, the etch selectivity between Si and SiN appears to be similar to the etch selectivity between p-doped Si and SiN.

In Table 8, several GCIB process conditions, and the resultant etch selectivity (between Si and SiN) and average roughness in Si are provided. Each GCIB process condition recites a GCIB composition containing 2%-6% Cl$_2$ in N$_2$. In some cases, He, Ar, or N$_2$ are added to the GCIB. The etch selectivity may be varied from less than unity to about 11, while achieving an average roughness ranging from about 12 Å to about 105 Å, by adjusting various GCIB process conditions, including GCIB composition, beam acceleration potential, P-Cell value, and flow rate.

TABLE 8

| GCIB Composition | Beam Acceleration Potential (kV) | P-Cell Value | Cl$_2$/N$_2$ Flow Rate (sccm) | Additive Flow Rate (sccm) | Etch Selectivity (Si/SiN) | Average Roughness-Si (Å) |
|---|---|---|---|---|---|---|
| 6% Cl$_2$/N$_2$ | 10 | 0 | 350 | | 8.2 | 92 |
| 6% Cl$_2$/N$_2$ | 30 | 0 | 350 | | 3.3 | 46 |
| 6% Cl$_2$/N$_2$ | 10 | 0 | 425 | | 8.7 | |
| 6% Cl$_2$/N$_2$ | 30 | 0 | 425 | | 3.7 | |
| 6% Cl$_2$/N$_2$ | 10 | 0 | 500 | | 10.7 | |
| 6% Cl$_2$/N$_2$ | 30 | 0 | 500 | | 4.9 | |
| 6% Cl$_2$/N$_2$ | 60 | 40 | 350 | | 3.3 | 32.5 |
| 6% Cl$_2$/N$_2$ | 60 | 40 | 350 | | 3.7 | 44 |
| 6% Cl$_2$/N$_2$ | 60 | 25 | 350 | | 3.3 | |
| 6% Cl$_2$/N$_2$ | 60 | 50 | 350 | | 3.5 | 47.8 |
| 6% Cl$_2$/N$_2$ | 60 | 50 | 450 | | 5 | 69 |
| 6% Cl$_2$/N$_2$ | 60 | 50 | 550 | | 4.6 | 105 |
| 4% Cl$_2$/N$_2$ | 60 | 50 | 225 | 125 (N$_2$) | 2.7 | 16.6 |
| 6% Cl$_2$/N$_2$ | 60 | 50 | 300 | 50 (He) | 3.2 | 31 |
| 6% Cl$_2$/N$_2$ | 30 | 50 | 350 | | 5.3 | 83 |
| 2% Cl$_2$/N$_2$ | 60 | 50 | 125 | 225 (N$_2$) | 0.7 | 11.6 |
| 4% Cl$_2$/N$_2$ | 60 | 50 | 225 | 125 (Ar) | 3.5 | 34 |

In Table 9, several GCIB process conditions, and the resultant etch selectivity (between Si and SiN) and average roughness in Si are provided. Each GCIB process condition recites a GCIB composition containing 4%-6% Cl$_2$ in He. The etch selectivity may be varied from a value of about 1.4 to about 6, while achieving an average roughness ranging from about 5 Å to about 40 Å, by adjusting various GCIB process conditions, including GCIB composition, beam acceleration potential, P-Cell value, and flow rate. The use of He as a carrier for Cl$_2$ appears to produce lower average roughness than the use of N$_2$ as a carrier for Cl$_2$.

TABLE 9

| GCIB Composition | Beam Acceleration Potential (kV) | P-Cell Value | Cl$_2$/He Flow Rate (sccm) | Additive Flow Rate (sccm) | Etch Selectivity (Si/SiN) | Average Roughness-Si (Å) |
|---|---|---|---|---|---|---|
| 6% Cl$_2$/He | 10 | 0 | 500 | | 6.1 | |
| 6% Cl$_2$/He | 10 | 0 | 550 | | 6.8 | |
| 6% Cl$_2$/He | 30 | 0 | 500 | | 2.8 | 38.4 |
| 6% Cl$_2$/He | 30 | 0 | 550 | | 3.4 | 30.0 |
| 4% Cl$_2$/He | 60 | 0 | 575 | | 2 | 13.0 |
| 4% Cl$_2$/He | 60 | 20 | 575 | | 1.9 | 13.0 |
| 4% Cl$_2$/He | 60 | 40 | 575 | | 2.1 | 7.1 |
| 4% Cl$_2$/He | 30 | 0 | 575 | | 1.6 | |
| 4% Cl$_2$/He | 30 | 40 | 600 | | 1.4 | 4.6 |

In Table 10, several GCIB process conditions, and the resultant etch selectivity (between Si and SiN) and average roughness in Si are provided. Each GCIB process condition recites a GCIB composition containing 35% HCl in He. The etch selectivity may be varied from a value of about 2 to about 7, while achieving an average roughness ranging from about 15 A to about 25 A, by adjusting various GCIB process conditions, including GCIB composition, beam acceleration potential, P-Cell value, and flow rate.

TABLE 10

| GCIB Composition | Beam Acceleration Potential (kV) | P-Cell Value | HCl/He Flow Rate (sccm) | Additive Flow Rate (sccm) | Etch Selectivity (Si/SiN) | Average Roughness-Si (A) |
| --- | --- | --- | --- | --- | --- | --- |
| 35% HCl/He | 10 | 0 | 400 | | 4.9 | 16.0 |
| 35% HCl/He | 10 | 0 | 400 | | 4.9 | 15.0 |
| 35% HCl/He | 30 | 0 | 400 | | 2.0 | 20.0 |
| 35% HCl/He | 30 | 0 | 400 | | | |
| 35% HCl/He | 60 | 40 | 400 | | 2.6 | 23.0 |
| 35% HCl/He | 10 | 0 | 475 | | 6.9 | 18.0 |
| 35% HCl/He | 10 | 0 | 475 | | 6.6 | 18.0 |
| 35% HCl/He | 30 | 0 | 475 | | 2.8 | 25.0 |
| 35% HCl/He | 30 | 0 | 475 | | 2.2 | 23.0 |

Figure 4L:
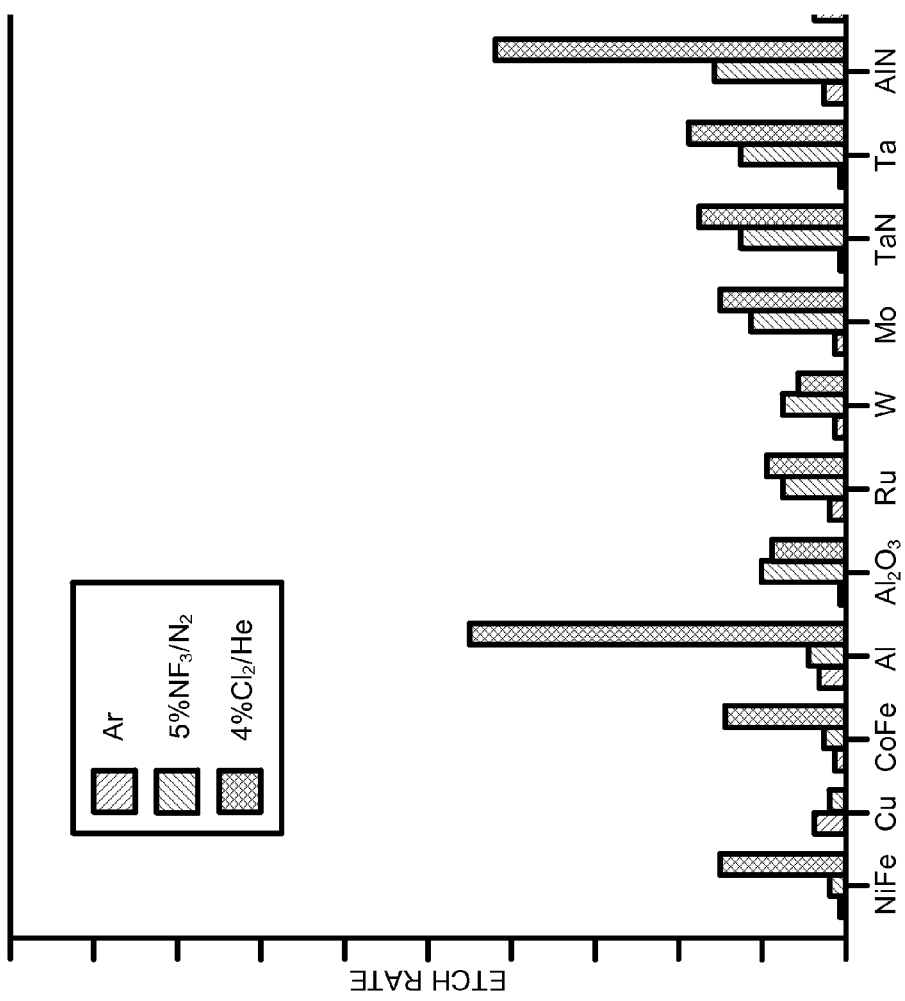

In FIG. 4L, exemplary data for etching material on a substrate is graphically depicted. FIG. 4L is a bar graph of etch rate of several materials, including NiFe, Cu, CoFe, Al, $Al_2O_3$, Ru, W, Mo, TaN, Ta, AlN, $SiO_2$, SiN, Si, SiC, photoresist (P.R.), and SiCOH, for three (3) GCIB etch processes. The GCIB processes include: (A) Ar; (B) 5% $NF_3/N_2$; and (C) 4% $Cl_2/He$. The GCIB process conditions for the three (3) GCIB etch processes are provided in Table 11.

TABLE 11

| GCIB Process Condition | GCIB Composition | Beam Acceleration Potential (kV) | P-Cell | Flow Rate (sccm) |
| --- | --- | --- | --- | --- |
| A | Ar | 30 | 0 | 250 |
| B | 5% $NF_3/N_2$ | 30 | 0 | 500 |
| C | 4% $Cl_2/He$ | 30 | 0 | 700 |

In Table 11, each GCIB process condition provides a GCIB composition, a beam acceleration potential (kV), a P-Cell value that relates to modification of the beam energy distribution function, and a flow rate of the GCIB composition.

As illustrated in FIG. 4L, the etch rate of several metal-containing materials, such as CoFe, NiFe, and Al, tends to improve when using a Cl-based GCIB chemistry, as opposed to a F-based GCIB chemistry. Also, when the GCIB contains only Ar, as in GCIB process condition "A", the etch rate is driven by a purely physical component, e.g., sputtering. However, FIG. 4L and Table 11 suggest that the GCIB composition may be selected to provide a chemical component to the etch process, and an increase in the etch rate.

Figure 5:
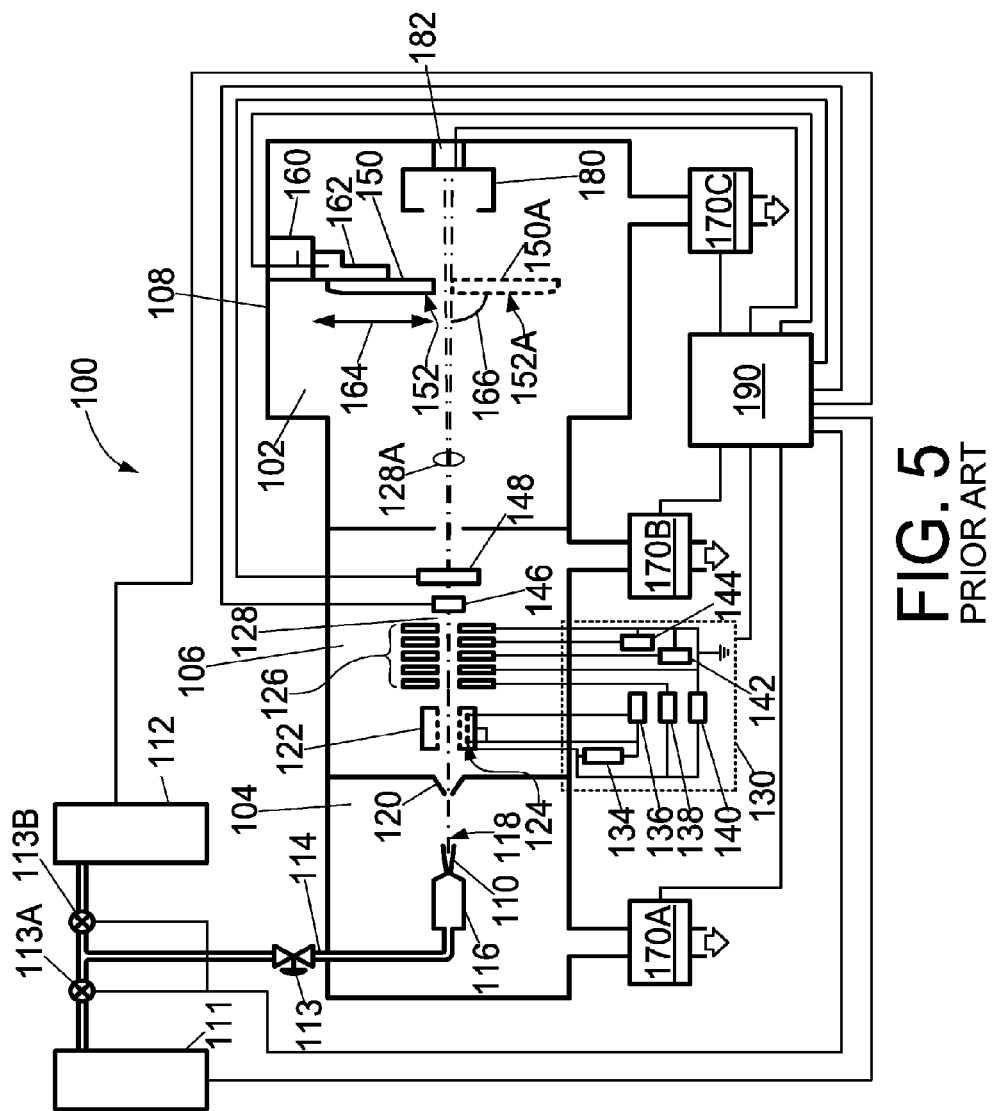
FIG. 5 is an illustration of a GCIB processing system.

Referring now to FIG. 5, a GCIB processing system 100 for treating a substrate as described above is depicted according to an embodiment. The GCIB processing system 100 comprises a vacuum vessel 102, substrate holder 150, upon which a substrate 152 to be processed is affixed, and vacuum pumping systems 170A, 170B, and 170C. Substrate 152 can be a semiconductor substrate, a wafer, a flat panel display (FPD), a liquid crystal display (LCD), or any other workpiece. GCIB processing system 100 is configured to produce a GCIB for treating substrate 152.

Referring still to GCIB processing system 100 in FIG. 5, the vacuum vessel 102 comprises three communicating chambers, namely, a source chamber 104, an ionization/acceleration chamber 106, and a processing chamber 108 to provide a reduced-pressure enclosure. The three chambers are evacuated to suitable operating pressures by vacuum pumping systems 170A, 170B, and 170C, respectively. In the three communicating chambers 104, 106, 108, a gas cluster beam can be formed in the first chamber (source chamber 104), while a GCIB can be formed in the second chamber (ionization/acceleration chamber 106) wherein the gas cluster beam is ionized and accelerated. Then, in the third chamber (processing chamber 108), the accelerated GCIB may be utilized to treat substrate 152.

As shown in FIG. 5, GCIB processing system 100 can comprise one or more gas sources configured to introduce one or more gases or mixture of gases to vacuum vessel 102. For example, a first gas composition stored in a first gas source 111 is admitted under pressure through a first gas control valve 113A to a gas metering valve or valves 113. Additionally, for example, a second gas composition stored in a second gas source 112 is admitted under pressure through a second gas control valve 113B to the gas metering valve or valves 113. Further, for example, the first gas composition or second gas composition or both can include a condensable inert gas, carrier gas or dilution gas. For example, the inert gas, carrier gas or dilution gas can include a noble gas, i.e., He, Ne, Ar, Kr, Xe, or Rn.

Furthermore, the first gas source 111 and the second gas source 112 may be utilized either alone or in combination with one another to produce ionized clusters. The material composition can include the principal atomic or molecular species of the elements desired to react with or be introduced to the material layer.

The high pressure, condensable gas comprising the first gas composition or the second gas composition or both is introduced through gas feed tube 114 into stagnation chamber 116 and is ejected into the substantially lower pressure vacuum through a properly shaped nozzle 110. As a result of the expansion of the high pressure, condensable gas from the stagnation chamber 116 to the lower pressure region of the source chamber 104, the gas velocity accelerates to supersonic speeds and gas cluster beam 118 emanates from nozzle 110.

The inherent cooling of the jet as static enthalpy is exchanged for kinetic energy, which results from the expansion in the jet, causes a portion of the gas jet to condense and form a gas cluster beam 118 having clusters, each consisting of from several to several thousand weakly bound atoms or molecules. A gas skimmer 120, positioned downstream from the exit of the nozzle 110 between the source chamber 104 and ionization/acceleration chamber 106, partially separates the gas molecules on the peripheral edge of the gas cluster beam 118, that may not have condensed into a cluster, from the gas molecules in the core of the gas cluster beam 118, that may have formed clusters. Among other reasons, this selection of a portion of gas cluster beam 118 can lead to a reduction in the pressure in the downstream regions where higher pressures may be detrimental (e.g., ionizer 122, and processing chamber 108). Furthermore, gas skimmer 120 defines an initial dimension for the gas cluster beam entering the ionization/acceleration chamber 106.

The GCIB processing system 100 may also include multiple nozzles with one or more skimmer openings. Additional details concerning the design of a multiple gas cluster ion beam system are provided in U.S. Patent Application Publication No. 2010/0193701 A1, entitled "Multiple Nozzle Gas Cluster Ion Beam System" and filed on Apr. 23, 2009; and U.S. Patent Application Publication No. 2010/0193472 A1, entitled "Multiple Nozzle Gas Cluster Ion Beam Processing System and Method of Operating" and filed on Mar. 26, 2010; the contents of which are herein incorporated by reference in their entirety.

After the gas cluster beam 118 has been formed in the source chamber 104, the constituent gas clusters in gas cluster beam 118 are ionized by ionizer 122 to form GCIB 128. The ionizer 122 may include an electron impact ionizer that produces electrons from one or more filaments 124, which are accelerated and directed to collide with the gas clusters in the gas cluster beam 118 inside the ionization/acceleration chamber 106. Upon collisional impact with the gas cluster, electrons of sufficient energy eject electrons from molecules in the gas clusters to generate ionized molecules. The ionization of gas clusters can lead to a population of charged gas cluster ions, generally having a net positive charge.

As shown in FIG. 5, beam electronics 130 are utilized to ionize, extract, accelerate, and focus the GCIB 128. The beam electronics 130 include a filament power supply 136 that provides voltage $V_F$ to heat the ionizer filament 124.

Additionally, the beam electronics 130 include a set of suitably biased high voltage electrodes 126 in the ionization/acceleration chamber 106 that extracts the cluster ions from the ionizer 122. The high voltage electrodes 126 then accelerate the extracted cluster ions to a desired energy and focus them to define GCIB 128. The kinetic energy of the cluster ions in GCIB 128 typically ranges from about 1000 electron volts (1 keV) to several tens of keV. For example, GCIB 128 can be accelerated to 1 to 100 keV.

As illustrated in FIG. 5, the beam electronics 130 further include an anode power supply 134 that provides voltage $V_A$ to an anode of ionizer 122 for accelerating electrons emitted from ionizer filament 124 and causing the electrons to bombard the gas clusters in gas cluster beam 118, which produces cluster ions.

Additionally, as illustrated in FIG. 5, the beam electronics 130 include an extraction power supply 138 that provides voltage $V_{EE}$ to bias at least one of the high voltage electrodes 126 to extract ions from the ionizing region of ionizer 122 and to form the GCIB 128. For example, extraction power supply 138 provides a voltage to a first electrode of the high voltage electrodes 126 that is less than or equal to the anode voltage of ionizer 122.

Furthermore, the beam electronics 130 can include an accelerator power supply 140 that provides voltage $V_{ACC}$ to bias one of the high voltage electrodes 126 with respect to the ionizer 122 so as to result in a total GCIB acceleration energy equal to about $V_{ACC}$ electron volts (eV). For example, accelerator power supply 140 provides a voltage to a second electrode of the high voltage electrodes 126 that is less than or equal to the anode voltage of ionizer 122 and the extraction voltage of the first electrode.

Further yet, the beam electronics 130 can include lens power supplies 142, 144 that may be provided to bias some of the high voltage electrodes 126 with potentials (e.g., $V_{L1}$ and $V_{L2}$) to focus the GCIB 128. For example, lens power supply 142 can provide a voltage to a third electrode of the high voltage electrodes 126 that is less than or equal to the anode voltage of ionizer 122, the extraction voltage of the first electrode, and the accelerator voltage of the second electrode, and lens power supply 144 can provide a voltage to a fourth electrode of the high voltage electrodes 126 that is less than or equal to the anode voltage of ionizer 122, the extraction voltage of the first electrode, the accelerator voltage of the second electrode, and the first lens voltage of the third electrode.

Note that many variants on both the ionization and extraction schemes may be used. While the scheme described here is useful for purposes of instruction, another extraction scheme involves placing the ionizer and the first element of the extraction electrode(s) (or extraction optics) at $V_{ACC}$. This typically requires fiber optic programming of control voltages for the ionizer power supply, but creates a simpler overall optics train. The invention described herein is useful regardless of the details of the ionizer and extraction lens biasing.

A beam filter 146 in the ionization/acceleration chamber 106 downstream of the high voltage electrodes 126 can be utilized to eliminate monomers, or monomers and light cluster ions from the GCIB 128 to define a filtered process GCIB 128A that enters the processing chamber 108. In one embodiment, the beam filter 146 substantially reduces the number of clusters having 100 or less atoms or molecules or both. The beam filter may comprise a magnet assembly for imposing a magnetic field across the GCIB 128 to aid in the filtering process.

Referring still to FIG. 5, a beam gate 148 is disposed in the path of GCIB 128 in the ionization/acceleration chamber 106. Beam gate 148 has an open state in which the GCIB 128 is permitted to pass from the ionization/acceleration chamber 106 to the processing chamber 108 to define process GCIB 128A, and a closed state in which the GCIB 128 is blocked from entering the processing chamber 108. A control cable conducts control signals from control system 190 to beam gate 148. The control signals controllably switch beam gate 148 between the open or closed states.

A substrate 152, which may be a wafer or semiconductor wafer, a flat panel display (FPD), a liquid crystal display (LCD), or other substrate to be processed by GCIB processing, is disposed in the path of the process GCIB 128A in the processing chamber 108. Because most applications contemplate the processing of large substrates with spatially uniform results, a scanning system may be desirable to uniformly scan the process GCIB 128A across large areas to produce spatially homogeneous results.

An X-scan actuator 160 provides linear motion of the substrate holder 150 in the direction of X-scan motion (into and out of the plane of the paper). A Y-scan actuator 162 provides linear motion of the substrate holder 150 in the direction of Y-scan motion 164, which is typically orthogonal to the X-scan motion. The combination of X-scanning and Y-scanning motions translates the substrate 152, held by the substrate holder 150, in a raster-like scanning motion through process GCIB 128A to cause a uniform (or otherwise programmed) irradiation of a surface of the substrate 152 by the process GCIB 128A for processing of the substrate 152.

The substrate holder 150 disposes the substrate 152 at an angle with respect to the axis of the process GCIB 128A so that the process GCIB 128A has an angle of beam incidence 166 with respect to a substrate 152 surface. The angle of beam incidence 166 may be 90 degrees or some other angle, but is typically 90 degrees or near 90 degrees. During Y-scanning, the substrate 152 and the substrate holder 150 move from the shown position to the alternate position "A" indicated by the designators 152A and 150A, respectively. Notice that in moving between the two positions, the substrate 152 is scanned through the process GCIB 128A, and in both extreme positions, is moved completely out of the path of the process GCIB 128A (over-scanned). Though not shown explicitly in FIG. 5, similar scanning and over-scan is performed in the (typically) orthogonal X-scan motion direction (in and out of the plane of the paper).

A beam current sensor 180 may be disposed beyond the substrate holder 150 in the path of the process GCIB 128A so as to intercept a sample of the process GCIB 128A when the substrate holder 150 is scanned out of the path of the process GCIB 128A. The beam current sensor 180 is typically a Faraday cup or the like, closed except for a beam-entry opening, and is typically affixed to the wall of the vacuum vessel 102 with an electrically insulating mount 182.

As shown in FIG. 5, control system 190 connects to the X-scan actuator 160 and the Y-scan actuator 162 through electrical cable and controls the X-scan actuator 160 and the Y-scan actuator 162 in order to place the substrate 152 into or out of the process GCIB 128A and to scan the substrate 152 uniformly relative to the process GCIB 128A to achieve desired processing of the substrate 152 by the process GCIB 128A. Control system 190 receives the sampled beam current collected by the beam current sensor 180 by way of an electrical cable and, thereby, monitors the GCIB and controls the GCIB dose received by the substrate 152 by removing the substrate 152 from the process GCIB 128A when a predetermined dose has been delivered.

Figure 6:
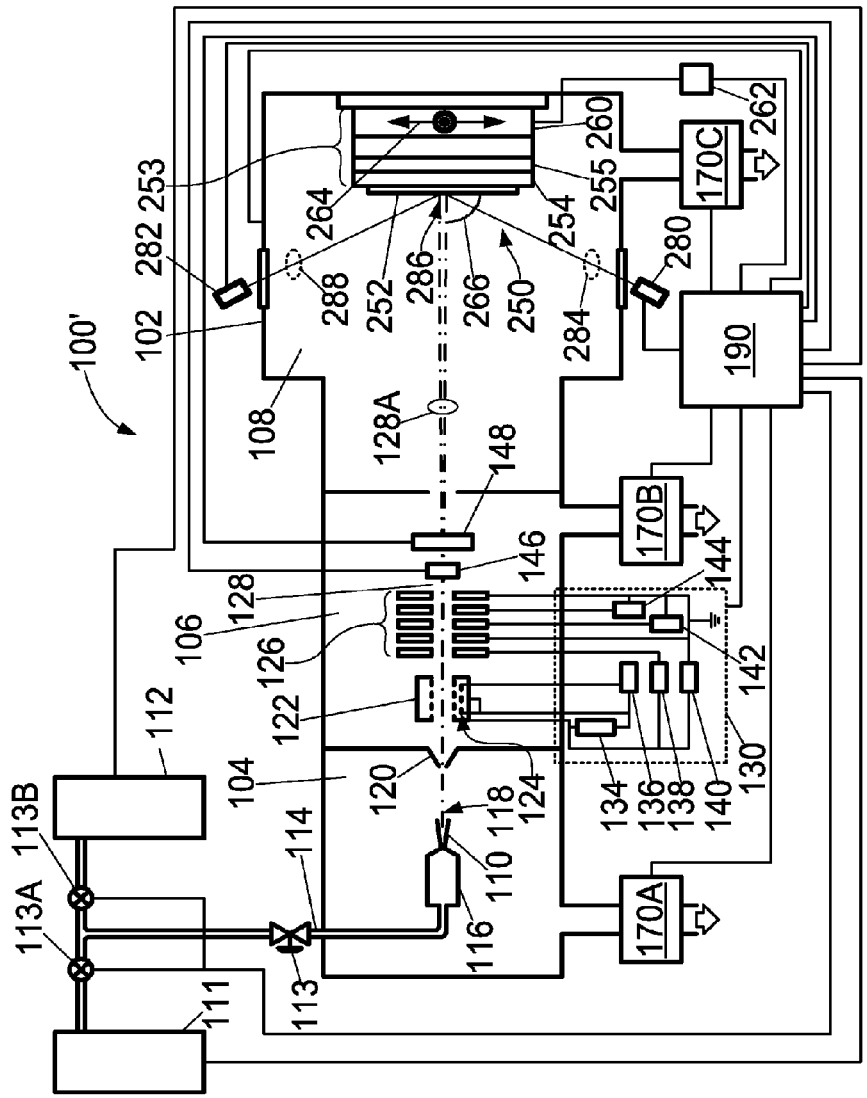
FIG. 6 is another illustration of a GCIB processing system.

In the embodiment shown in FIG. 6, the GCIB processing system 100' can be similar to the embodiment of FIG. 5 and further comprise a X-Y positioning table 253 operable to hold and move a substrate 252 in two axes, effectively scanning the substrate 252 relative to the process GCIB 128A. For example, the X-motion can include motion into and out of the plane of the paper, and the Y-motion can include motion along direction 264.

The process GCIB 128A impacts the substrate 252 at a projected impact region 286 on a surface of the substrate 252, and at an angle of beam incidence 266 with respect to the surface of substrate 252. By X-Y motion, the X-Y positioning table 253 can position each portion of a surface of the substrate 252 in the path of process GCIB 128A so that every region of the surface may be made to coincide with the projected impact region 286 for processing by the process GCIB 128A. An X-Y controller 262 provides electrical signals to the X-Y positioning table 253 through an electrical cable for controlling the position and velocity in each of X-axis and Y-axis directions. The X-Y controller 262 receives control signals from, and is operable by, control system 190 through an electrical cable. X-Y positioning table 253 moves by continuous motion or by stepwise motion according to conventional X-Y table positioning technology to position different regions of the substrate 252 within the projected impact region 286. In one embodiment, X-Y positioning table 253 is programmably operable by the control system 190 to scan, with programmable velocity, any portion of the substrate 252 through the projected impact region 286 for GCIB processing by the process GCIB 128A.

The substrate holding surface 254 of positioning table 253 is electrically conductive and is connected to a dosimetry processor operated by control system 190. An electrically insulating layer 255 of positioning table 253 isolates the substrate 252 and substrate holding surface 254 from the base portion 260 of the positioning table 253. Electrical charge induced in the substrate 252 by the impinging process GCIB 128A is conducted through substrate 252 and substrate holding surface 254, and a signal is coupled through the positioning table 253 to control system 190 for dosimetry measurement. Dosimetry measurement has integrating means for integrating the GCIB current to determine a GCIB processing dose. Under certain circumstances, a target-neutralizing source (not shown) of electrons, sometimes referred to as electron flood, may be used to neutralize the process GCIB 128A. In such case, a Faraday cup (not shown, but which may be similar to beam current sensor 180 in FIG. 5) may be used to assure accurate dosimetry despite the added source of electrical charge, the reason being that typical Faraday cups allow only the high energy positive ions to enter and be measured.

In operation, the control system 190 signals the opening of the beam gate 148 to irradiate the substrate 252 with the process GCIB 128A. The control system 190 monitors measurements of the GCIB current collected by the substrate 252 in order to compute the accumulated dose received by the substrate 252. When the dose received by the substrate 252 reaches a predetermined dose, the control system 190 closes the beam gate 148 and processing of the substrate 252 is complete. Based upon measurements of the GCIB dose received for a given area of the substrate 252, the control system 190 can adjust the scan velocity in order to achieve an appropriate beam dwell time to treat different regions of the substrate 252.

Alternatively, the process GCIB 128A may be scanned at a constant velocity in a fixed pattern across the surface of the substrate 252; however, the GCIB intensity is modulated (may be referred to as Z-axis modulation) to deliver an intentionally non-uniform dose to the sample. The GCIB intensity may be modulated in the GCIB processing system 100' by any of a variety of methods, including varying the gas flow from a GCIB source supply; modulating the ionizer 122 by either varying a filament voltage $V_F$ or varying an anode voltage $V_A$; modulating the lens focus by varying lens voltages $V_{L1}$ and/or $V_{L2}$; or mechanically blocking a portion of the GCIB with a variable beam block, adjustable shutter, or variable aperture. The modulating variations may be continuous analog variations or may be time modulated switching or gating.

The processing chamber 108 may further include an in-situ metrology system. For example, the in-situ metrology system may include an optical diagnostic system having an optical transmitter 280 and optical receiver 282 configured to illuminate substrate 252 with an incident optical signal 284 and to receive a scattered optical signal 288 from substrate 252, respectively. The optical diagnostic system comprises optical windows to permit the passage of the incident optical signal 284 and the scattered optical signal 288 into and out of the processing chamber 108. Furthermore, the optical transmitter 280 and the optical receiver 282 may comprise transmitting and receiving optics, respectively. The optical transmitter 280 receives, and is responsive to, controlling electrical signals from the control system 190. The optical receiver 282 returns measurement signals to the control system 190.

The in-situ metrology system may comprise any instrument configured to monitor the progress of the GCIB processing. According to one embodiment, the in-situ metrology system may constitute an optical scatterometry system. The scatterometry system may include a scatterometer, incorporating beam profile ellipsometry (ellipsometer) and beam profile reflectometry (reflectometer), commercially available from Therma-Wave, Inc. (1250 Reliance Way, Fremont, Calif. 94539) or Nanometrics, Inc. (1550 Buckeye Drive, Milpitas, Calif. 95035).

For instance, the in-situ metrology system may include an integrated Optical Digital Profilometry (iODP) scatterometry module configured to measure process performance data resulting from the execution of a treatment process in the GCIB processing system 100'. The metrology system may, for example, measure or monitor metrology data resulting from the treatment process. The metrology data can, for example, be utilized to determine process performance data that characterizes the treatment process, such as a process rate, a relative process rate, a feature profile angle, a critical dimension, a feature thickness or depth, a feature shape, etc. For example, in a process for directionally depositing material on a substrate, process performance data can include a critical dimension (CD), such as a top, middle or bottom CD in a feature (i.e., via, line, etc.), a feature depth, a material thickness, a sidewall angle, a sidewall shape, a deposition rate, a relative deposition rate, a spatial distribution of any parameter thereof, a parameter to characterize the uniformity of any spatial distribution thereof, etc. Operating the X-Y positioning table 253 via control signals from control system 190, the in-situ metrology system can map one or more characteristics of the substrate 252.

Figure 7:
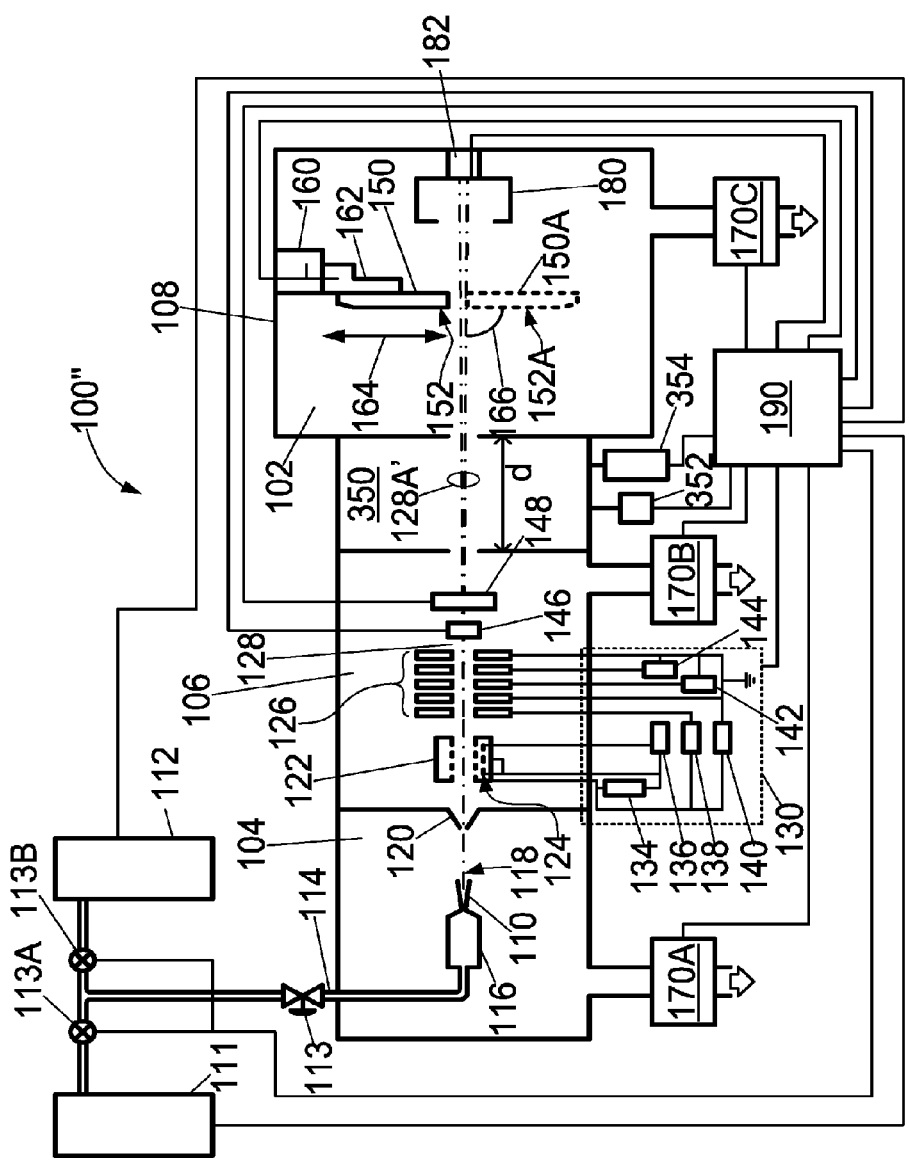
FIG. 7 is yet another illustration of a GCIB processing system.

In the embodiment shown in FIG. 7, the GCIB processing system 100" can be similar to the embodiment of FIG. 5 and further comprise a pressure cell chamber 350 positioned, for example, at or near an outlet region of the ionization/acceleration chamber 106. The pressure cell chamber 350 comprises an inert gas source 352 configured to supply a background gas to the pressure cell chamber 350 for elevating the pressure in the pressure cell chamber 350, and a pressure sensor 354 configured to measure the elevated pressure in the pressure cell chamber 350.

The pressure cell chamber 350 may be configured to modify the beam energy distribution of GCIB 128 to produce a modified processing GCIB 128A'. This modification of the beam energy distribution is achieved by directing GCIB 128 along a GCIB path through an increased pressure region within the pressure cell chamber 350 such that at least a portion of the GCIB traverses the increased pressure region. The extent of modification to the beam energy distribution may be characterized by a pressure-distance integral along the at least a portion of the GCIB path, where distance (or length of the pressure cell chamber 350) is indicated by path length (d). When the value of the pressure-distance integral is increased (either by increasing the pressure and/or the path length (d)), the beam energy distribution is broadened and the peak energy is decreased. When the value of the pressure-distance integral is decreased (either by decreasing the pressure and/or the path length (d)), the beam energy distribution is narrowed and the peak energy is increased. Further details for the design of a pressure cell may be determined from U.S. Pat. No. 7,060,989, entitled "Method and apparatus for improved processing with a gas-cluster ion beam"; the content of which is incorporated herein by reference in its entirety.

Control system 190 comprises a microprocessor, memory, and a digital I/O port capable of generating control voltages sufficient to communicate and activate inputs to GCIB processing system 100 (or 100', 100"), as well as monitor outputs from GCIB processing system 100 (or 100', 100"). Moreover, control system 190 can be coupled to and can exchange information with vacuum pumping systems 170A, 170B, and 170C, first gas source 111, second gas source 112, first gas control valve 113A, second gas control valve 113B, beam electronics 130, beam filter 146, beam gate 148, the X-scan actuator 160, the Y-scan actuator 162, and beam current sensor 180. For example, a program stored in the memory can be utilized to activate the inputs to the aforementioned components of GCIB processing system 100 according to a process recipe in order to perform a GCIB process on substrate 152.

However, the control system 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

The control system 190 can be used to configure any number of processing elements, as described above, and the control system 190 can collect, provide, process, store, and display data from processing elements. The control system 190 can include a number of applications, as well as a number of controllers, for controlling one or more of the processing elements. For example, control system 190 can include a graphic user interface (GUI) component (not shown) that can provide interfaces that enable a user to monitor and/or control one or more processing elements.

Control system 190 can be locally located relative to the GCIB processing system 100 (or 100', 100"), or it can be remotely located relative to the GCIB processing system 100 (or 100', 100"). For example, control system 190 can exchange data with GCIB processing system 100 using a direct connection, an intranet, and/or the Internet. Control system 190 can be coupled to an intranet at, for example, a customer site (i.e., a device maker, etc.), or it can be coupled to an intranet at, for example, a vendor site (i.e., an equipment manufacturer). Alternatively or additionally, control system 190 can be coupled to the Internet. Furthermore, another computer (i.e., controller, server, etc.) can access control system 190 to exchange data via a direct connection, an intranet, and/or the Internet.

Substrate 152 (or 252) can be affixed to the substrate holder 150 (or substrate holder 250) via a clamping system (not shown), such as a mechanical clamping system or an electrical clamping system (e.g., an electrostatic clamping system). Furthermore, substrate holder 150 (or 250) can include a heating system (not shown) or a cooling system (not shown) that is configured to adjust and/or control the temperature of substrate holder 150 (or 250) and substrate 152 (or 252).

Vacuum pumping systems 170A, 170B, and 170C can include turbo-molecular vacuum pumps (TMP) capable of pumping speeds up to about 5000 liters per second (and greater) and a gate valve for throttling the chamber pressure. In conventional vacuum processing devices, a 1000 to 3000 liter per second TMP can be employed. TMPs are useful for low pressure processing, typically less than about 50 mTorr. Although not shown, it may be understood that pressure cell chamber 350 may also include a vacuum pumping system. Furthermore, a device for monitoring chamber pressure (not shown) can be coupled to the vacuum vessel 102 or any of the three vacuum chambers 104, 106, 108. The pressure-measuring device can be, for example, a capacitance manometer or ionization gauge.

Figure 8:
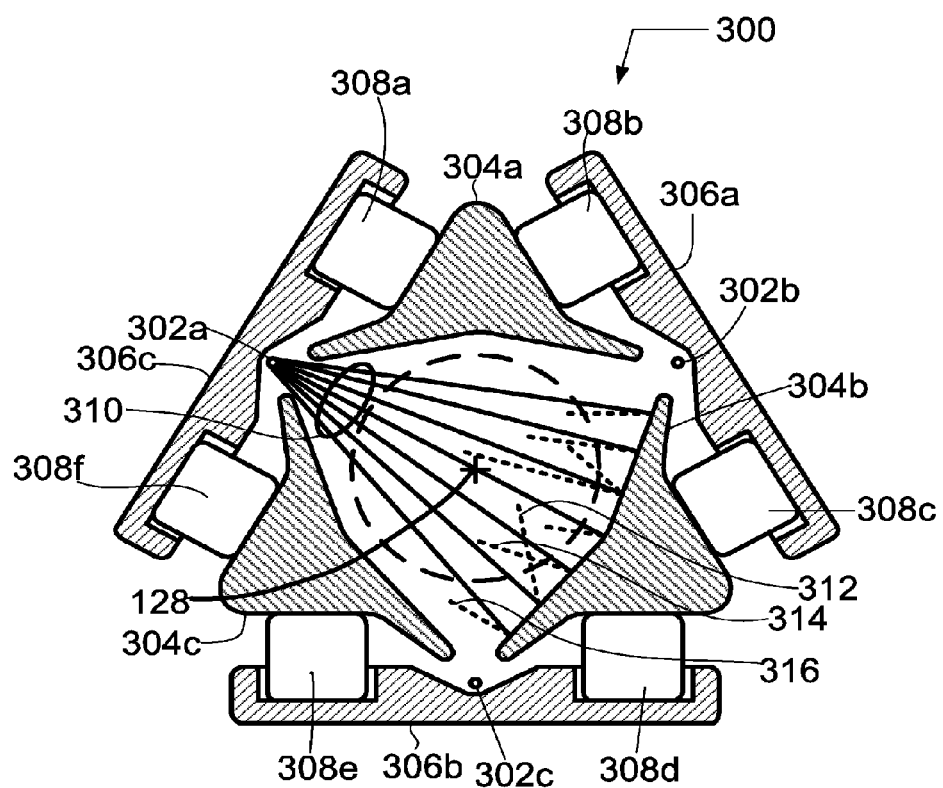
FIG. 8 is an illustration of an ionization source for a GCIB processing system.

Referring now to FIG. 8, a section 300 of an ionizer (122, FIGS. 5, 6 and 7) for ionizing a gas cluster jet (gas cluster beam 118, FIGS. 5, 6 and 7) is shown. The section 300 is normal to the axis of GCIB 128. For typical gas cluster sizes (2000 to 15000 atoms), clusters leaving the gas skimmer (120, FIGS. 5, 6 and 7) and entering an ionizer (122, FIGS. 5, 6 and 7) will travel with a kinetic energy of about 130 to 1000 electron volts (eV). At these low energies, any departure from space charge neutrality within the ionizer 122 will result in a rapid dispersion of the jet with a significant loss of beam current. FIG. 8 illustrates a self-neutralizing ionizer. As with other ionizers, gas clusters are ionized by electron impact. In this design, thermo-electrons (seven examples indicated by 310) are emitted from multiple linear thermionic filaments 302a, 302b, and 302c (typically tungsten) and are extracted and focused by the action of suitable electric fields provided by electron-repeller electrodes 306a, 306b, and 306c and beam-forming electrodes 304a, 304b, and 304c. Thermo-electrons 310 pass through the gas cluster jet and the jet axis and then strike the opposite beam-forming electrode 304b to produce low energy secondary electrons (312, 314, and 316 indicated for examples).

Though (for simplicity) not shown, linear thermionic filaments 302b and 302c also produce thermo-electrons that subsequently produce low energy secondary electrons. All the secondary electrons help ensure that the ionized cluster jet remains space charge neutral by providing low energy electrons that can be attracted into the positively ionized gas cluster jet as required to maintain space charge neutrality. Beam-forming electrodes 304a, 304b, and 304c are biased positively with respect to linear thermionic filaments 302a, 302b, and 302c and electron-repeller electrodes 306a, 306b, and 306c are negatively biased with respect to linear thermionic filaments 302a, 302b, and 302c. Insulators 308a, 308b, 308c, 308d, 308e, and 308f electrically insulate and support electrodes 304a, 304b, 304c, 306a, 306b, and 306c. For example, this self-neutralizing ionizer is effective and achieves over 1000 micro Amps argon GCIBs.

Figure 9:
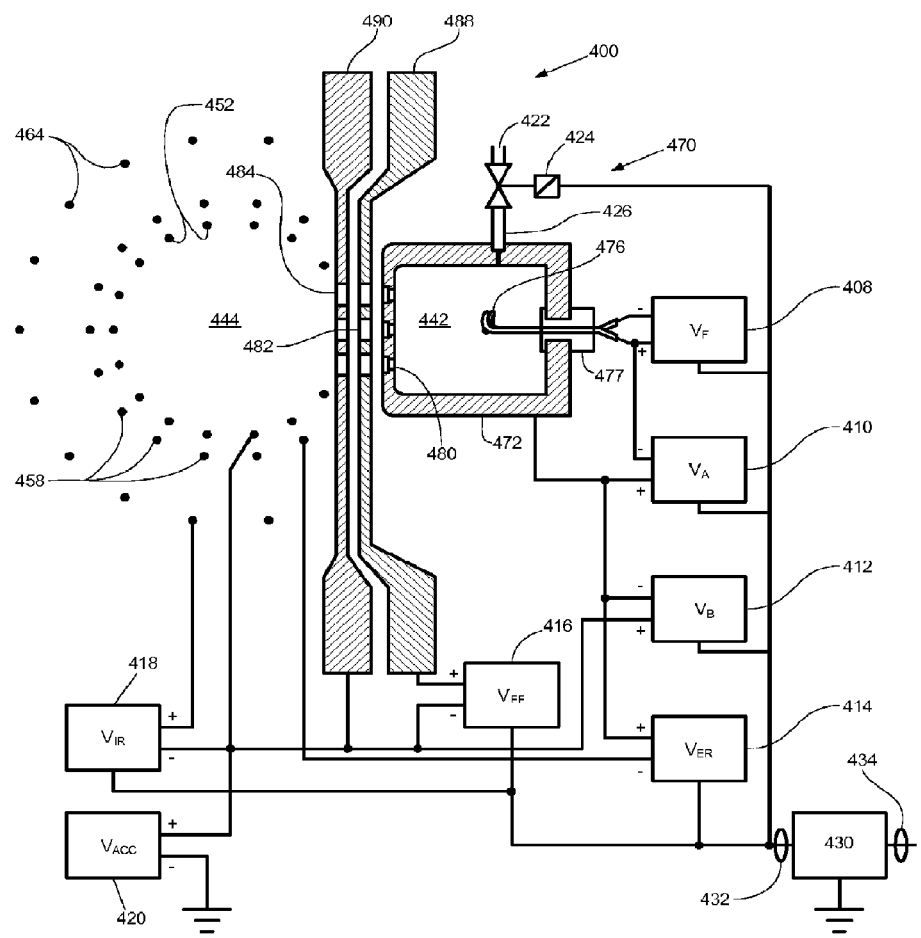
FIG. 9 is an illustration of another ionization source for a GCIB processing system.

Alternatively, ionizers may use electron extraction from plasma to ionize clusters. The geometry of these ionizers is quite different from the three filament ionizer described above but the principles of operation and the ionizer control are very similar. Referring now to FIG. 9, a section 400 of an ionizer (122, FIGS. 5, 6 and 7) for ionizing a gas cluster jet (gas cluster beam 118, FIGS. 5, 6 and 7) is shown. The section 400 is normal to the axis of GCIB 128. For typical gas cluster sizes (2000 to 15000 atoms), clusters leaving the gas skimmer (120, FIGS. 5, 6 and 7) and entering an ionizer (122, FIGS. 5, 6 and 7) will travel with a kinetic energy of about 130 to 1000 electron volts (eV). At these low energies, any departure from space charge neutrality within the ionizer 122 will result in a rapid dispersion of the jet with a significant loss of beam current. FIG. 9 illustrates a self-neutralizing ionizer. As with other ionizers, gas clusters are ionized by electron impact.

The ionizer includes an array of thin rod anode electrodes 452 that is supported and electrically connected by a support plate (not shown). The array of thin rod anode electrodes 452 is substantially concentric with the axis of the gas cluster beam (e.g., gas cluster beam 118, FIGS. 5, 6 and 7). The ionizer also includes an array of thin rod electron-repeller rods 458 that is supported and electrically connected by another support plate (not shown). The array of thin rod electron-repeller electrodes 458 is substantially concentric with the axis of the gas cluster beam (e.g., gas cluster beam 118, FIGS. 5, 6 and 7). The ionizer further includes an array of thin rod ion-repeller rods 464 that is supported and electrically connected by yet another support plate (not shown). The array of thin rod ion-repeller electrodes 464 is substantially concentric with the axis of the gas cluster beam (e.g., gas cluster beam 118, FIGS. 5, 6 and 7).

Energetic electrons are supplied to a beam region 444 from a plasma electron source 470. The plasma electron source 470 comprises a plasma chamber 472 within which plasma is formed in plasma region 442. The plasma electron source 470 further comprises a thermionic filament 476, a gas entry aperture 426, and a plurality of extraction apertures 480. The thermionic filament 476 is insulated from the plasma chamber 470 via insulator 477. As an example, the thermionic filament 476 may include a tungsten filament having one-and-a-half turns in a "pigtail" configuration.

The section 400 of the gas cluster ionizer comprises an electron-acceleration electrode 488 having plural apertures 482. Additionally, the section 400 comprises an electron-deceleration electrode 490 having plural apertures 484. The plural apertures 482, the plural apertures 484, and the plural extraction apertures 480 are all aligned from the plasma region 442 to the beam region 444.

Plasma forming gas, such as a noble gas, is admitted to the plasma chamber 472 through gas entry aperture 426. An insulate gas feed line 422 provides pressurized plasma forming gas to a remotely controllable gas valve 424 that regulates the admission of plasma forming gas to the plasma chamber 472.

A filament power supply 408 provides filament voltage ($V_F$) for driving current through thermionic filament 476 to stimulate thermo-electron emission. Filament power supply 408 controllably provides about 140 to 200 A (amps) at 3 to 5 V (volts). An arc power supply 410 controllably provides an arc voltage ($V_A$) to bias the plasma chamber 472 positive with respect to the thermionic filament 476. Arc power supply 410 is typically operated at a fixed voltage, typically about 35 V, and provides means for accelerating the electrons within the plasma chamber 472 for forming plasma. The filament current is controlled to regulate the arc current supplied by the arc power supply 410. Arc power supply 410 is capable of providing up to 5 A arc current to the plasma arc.

Electron deceleration electrode 490 is biased positively with respect to the plasma chamber 472 by electron bias power supply 412. Electron bias power supply 412 provides bias voltage ($V_B$) that is controllably adjustable over the range of from 30 to 400 V. Electron acceleration electrode 488 is biased positively with respect to electron deceleration electrode 490 by electron extraction power supply 416. Electron extraction power supply 416 provides electron extraction voltage ($V_{EE}$) that is controllable in the range from 20 to 250 V. An acceleration power supply 420 supplies acceleration voltage ($V_{ACC}$) to bias the array of thin rod anode electrodes 452 and electron deceleration electrode 490 positive with respect to earth ground. $V_{ACC}$ is the acceleration potential for gas cluster ions produced by the gas cluster ionizer shown in section 400 and is controllable and adjustable in the range from 1 to 100 kV. An electron repeller power supply 414 provides electron repeller bias voltage ($V_{ER}$) for biasing the array of thin rod electron-repeller electrodes 458 negative with respect to $V_{ACC}$. $V_{ER}$ is controllable in the range of from 50 to 100 V. An ion repeller power supply 418 provides ion repeller bias voltage ($V_{IR}$) to bias the array of thin rod ion-repeller electrodes 464 positive with respect to $V_{ACC}$. $V_{IR}$ is controllable in the range of from 50 to 150 V.

A fiber optics controller 430 receives electrical control signals on cable 434 and converts them to optical signals on control link 432 to control components operating at high potentials using signals from a grounded control system. The fiber optics control link 432 conveys control signals to remotely controllable gas valve 424, filament power supply 408, arc power supply 410, electron bias power supply 412, electron repeller power supply 414, electron extraction power supply 416, and ion repeller power supply 418.

For example, the ionizer design may be similar to the ionizer described in U.S. Pat. No. 7,173,252, entitled "Ionizer and method for gas-cluster ion-beam formation"; the content of which is incorporated herein by reference in its entirety.

The ionizer (122, FIGS. 5, 6 and 7) may be configured to modify the beam energy distribution of GCIB 128 by altering the charge state of the GCIB 128. For example, the charge state may be modified by adjusting an electron flux, an electron energy, or an electron energy distribution for electrons utilized in electron collision-induced ionization of gas clusters.

Figure 10:
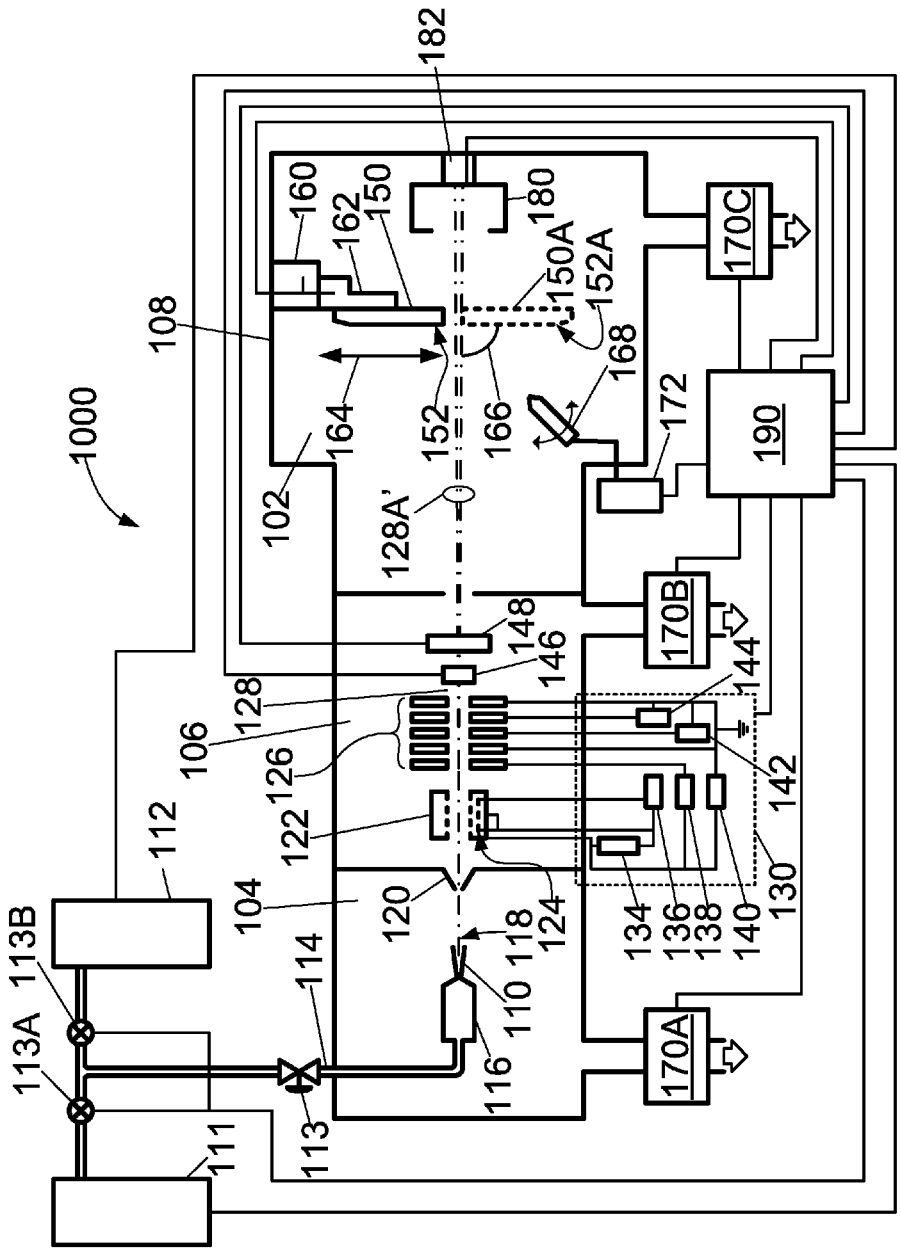
FIG. 10 is an illustration of another GCIB processing system.

In the embodiment shown in FIG. 10, the GCIB processing system 1000 can be similar to the embodiment of FIG. 5 and further comprise one or more molecular beam nozzles 168 positioned, for example, in the processing chamber 108 at or near an outlet region of the ionization/acceleration chamber 106. The molecular beam nozzle 168 may receive high pressure gas from a gas source 172. The molecular beam nozzle 168 may include a gas intake connection that receives the gas at a high pressure and an orifice (not shown) that enables molecules of gas to exit the molecular beam nozzle 168 at high velocity. Generally, the gas velocity may be less than the speed of sound. However, in other embodiments, the gas velocity may be greater than the speed of sound. The gas molecules may exit the orifice at a very high speed that may enable the molecules to form a molecular beam characterized by a narrow beam angular distribution function, i.e., a collimated or substantially collimated trajectory of gas molecule(s) that are projected into the process chamber 108. More generally, the term molecular beam, as referred to herein, may represent a directed effusion of gas or vapor, containing atomic and/or molecular constituents, oriented to intersect with the GCIB including, for example, gas or vapor jets, or gas or vapor beams (substantially) collimated using one or more skimmers. The high pressure gas may include, but are not limited to, noble gases (e.g., Ar, Ne, etc.), nitrogen, oxidizing gases (e.g., $O_2$, $O_3$, etc.), halogen gases, pyrophoric gases (e.g., SiH4), In one embodiment, the molecular beam may include a noble gas, nitrogen, or a combination thereof. In certain instances, the molecular beam may not be relatively inert, in that the primary purpose of the molecular beam may not to be chemically reactive with the GCIB. For example, the interaction between the molecular beam and the GCIB may be more physical (e.g., collisions of atoms) than chemical in nature. However, it should not be inferred that any chemical reaction is absent from the interaction. But, in this embodiment, the physical interaction may at least have a higher degree of influence over the GCIB or the substrate than the chemical reaction However, in another embodiment, the molecular beam may include more reactive gases that may increase the chemical interaction between the molecular beam and the GCIB. For example, an oxidizing gas (e.g., $O_2$, $O_3$), a halogen gas (e.g., Cl, F, etc.), or a pyrophoric gase (e.g., $SiH_4$) that may be used in conjunction with any of the GCIB gases described above. In this instance, the interaction between the molecular beam and the GCIB may include a physical interaction and a chemical interaction with the GCIB, the substrate, or a combination thereof. The chemical reaction may include forming another chemical molecule that may not be provided to or pass through the molecular beam nozzle. The chemical molecule may be used to alter the characteristics of the GCIB and/or the substrate.

The molecular beam nozzle may include an orifice, a converging nozzle, or a converging-diverging nozzle, for example. And, the molecular beam nozzle may or may not include a nozzle skimmer. The molecular beam (not shown) forms a localized region of high pressure that may be used to alter or modify the characteristics of the GCIB 128A'. For example, in one embodiment, the molecular beam may collide with the GCIB 128A' to alter the beam energy distribution, beam angular distribution, beam composition, or angle of the GCIB 128A' through the collision of constituents in both the GCIB 128A' and the molecular beam. In another embodiment, the molecular beam may be directed towards the intersection of the GCIB 128A' and the substrate 152. In this way, the intersection of the one or more molecular beams with the GCIB 128A' at or above an exposed surface of substrate 152 may influence the chemical and/or physical interaction between the GCIB 128A' and the substrate 152. For example, a localized high pressure region may be formed at the substrate's 152 surface which may alter the ion beam characteristics and/or also influence the chemical reaction that may be occurring at the substrate's 152 surface as a result of the GCIB 128A'. In both of the aforementioned embodiments, the etch characteristics of the GCIB 128A' may be modified which may impact the etch rate or etch profile at the substrate 152. And, while the interaction between a GCIB and one or more molecular beams is described in the context of GCIB etching, it may be used to perform any type of GCIB treatment including, but not limited to, GCIB-assisted cleaning, depositing, growing, doping, chemically or physically modifying, densifying, amorphizing, smoothing, etc.

FIG. 10 illustrates just one embodiment of the positioning of the molecular beam nozzle 168 at an angle towards the GCIB 128A' and at an offset distance from the substrate 152. The angle may represent the relative position between the molecular beam and the GCIB 128A'. The angle may be measured from the GCIB 128A' to the molecular beam or vice versa. The offset distance may be the distance between the intersection point of the molecular beam and the GCIB 128A' and the surface of the substrate 152. In other embodiments, the molecular beam nozzle 168 may be positioned at any orientation that may enable the molecular beam to intercept the ion beam at angles between substantially 90 degrees or near zero degrees. The angle may vary based on the desired process conditions at the surface of the substrate 152. Likewise, the offset distance may also vary from process to process.

In addition to the capabilities described above in FIG. 5, the control system 190 of FIG. 10 may also control the gas source 172 and the positioning of the molecular gas nozzle 168. However, the control system 190 may be implemented as a general purpose computer system that performs a portion or all of the microprocessor based processing steps of the invention in response to a processor executing one or more sequences of one or more instructions contained in a memory. Such instructions may be read into the controller memory from another computer readable medium, such as a hard disk or a removable media drive. One or more processors in a multi-processing arrangement may also be employed as the controller microprocessor to execute the sequences of instructions contained in main memory. In alternative embodiments, hard-wired circuitry may be used in place of or in combination with software instructions. Thus, embodiments are not limited to any specific combination of hardware circuitry and software.

FIGS. 11A-11C include schematic diagrams that describe the position of the intersection of the molecular beam with the GCIB 128A' (e.g., FIG. 11A) and the relative positioning of molecular gas nozzle 168 with respect to the GCIB 128A' and the substrate 152 (e.g., FIGS. 11B & 11C). As shown in FIG. 11A, the angle of incidence 170 between the molecular beam and the GCIB 128A' may be between zero and 90 degrees. The angle of incidence may be measured from the GCIB 128A' up to the molecular beam. The molecular beam is not shown in FIG. 11A.

In FIG. 11B, the molecular beam 174 is shown intersecting within the GCIB 128A' at intersection point 176 at an incidence angle 178. The intersection point 176 may be located at an offset distance 180 from the substrate 152. As noted above, the incidence angle may vary between zero and 90 degrees. Likewise, the offset distance may also vary along the length of the GCIB 128A'. The molecular beam nozzle 168 may also vary by a beam offset distance 182 that represents the distance between the GCIB 128A' and the molecular beam nozzle 168. These distance and position variables illustrated in FIG. 11A may be varied to control or adjust the etching or chemical processing that may occur at the substrate 152. As shown in FIG. 11C, the angle of incidence 184 and the beam offset distance 186 can vary such that the molecular beam 174 interacts directly with the substrate 152 or very near the surface of the substrate 152.

FIGS. 12A-12H are illustrations of an ion beam (e.g., GCIB 128A') that may be intersected with a molecular beam 174 as part of one or more embodiments of the GCIB processing system 1000 shown in FIG. 10. Broadly, one or more molecular beam nozzles 168 may be positioned within the processing chamber 108 that inject one or more molecular beams 174 into the GCIB 128A', the substrate 152, or both. The positioning of the one or more molecular beam nozzles 168 may be symmetrical or asymmetrical within a two or three dimensional arrangement. FIGS. 12A-12H represent specific embodiments and are limited to two dimensions for ease of illustration only. However, the molecular beam nozzles 168, 188 may be configured in a three dimensional arrangement proximate to the substrate 152.

Figure 12A:
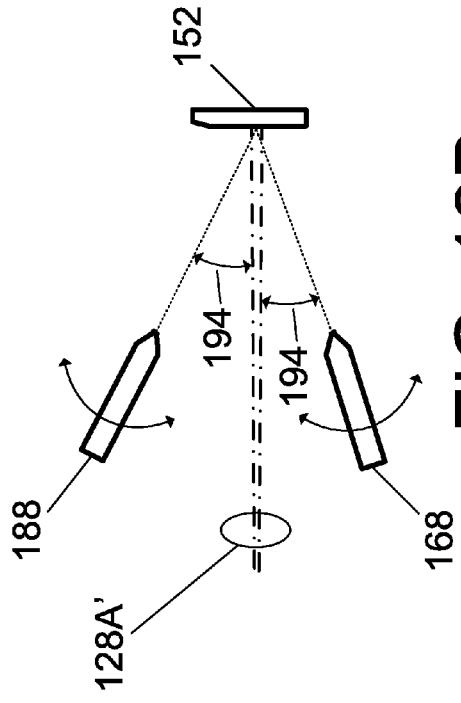

FIG. 12A illustrates process chamber 108 arrangement that includes a first molecular beam nozzle 168 and a second molecular beam nozzle 188 that are positioned symmetrically around the GCIB 128A'. In this instance, the symmetry may include a similar angle of incidence 192 for the molecular beams from the first beam nozzle 168 and the second molecular beam nozzle 188. The first molecular beam 168 and the second molecular beam nozzle 188 may also have a similar offset distance 190. In this embodiment, the molecular beams from the first molecular beam 168 and the second molecular beam nozzle 188 may intersection the GCIB 128A' at substantially the same point.

Figure 12B:
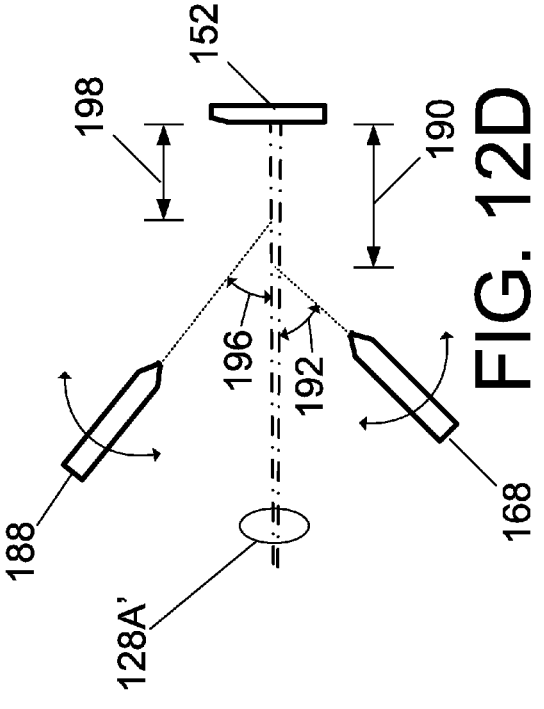

FIG. 12B illustrates an embodiment that is different from the embodiment shown in FIG. 12A. The first molecular beam 168 and the second molecular beam nozzle 188 are still arranged symmetrically within the process chamber 108. However, the angle of incidence 194 has been adjusted such that the molecular beams intersect at or near a surface of the substrate 152. In another embodiment, the GCIB molecular beam process may include shifting from the FIG. 12A embodiment to the FIG. 12B embodiment (or any other embodiment) or vice versa for the same substrate. However, the embodiments of FIGS. 12A-12H may also be implemented independently of each other, if needed.

Figure 12C:
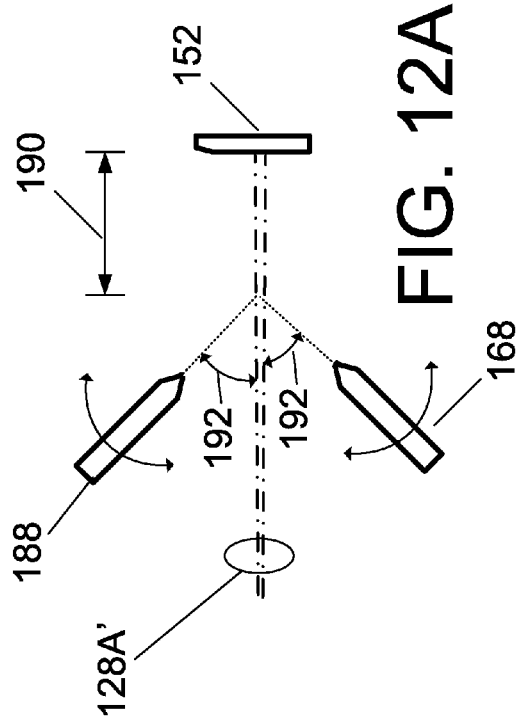

FIG. 12C illustrates one asymmetrical arrangement of the first molecular beam nozzle 168 and the second molecular beam nozzle 188. For example, the first molecular beam 168 may have a first angle of incidence with the GCIB 128A' that is different from the second angle of incidence 194 for the second molecular beam nozzle 188. In this way, the intersection points of first molecular beam 168 and the second molecular beam nozzle 188 may be different. In this illustrated embodiment, the molecular beam from the first molecular beam 168 intersects the GCIB128A' at an offset distance 190. While the molecular beam from the second molecular beam nozzle 188 may intersect the GCIB 128A' at or near the surface of the substrate 152.

Figure 12D:
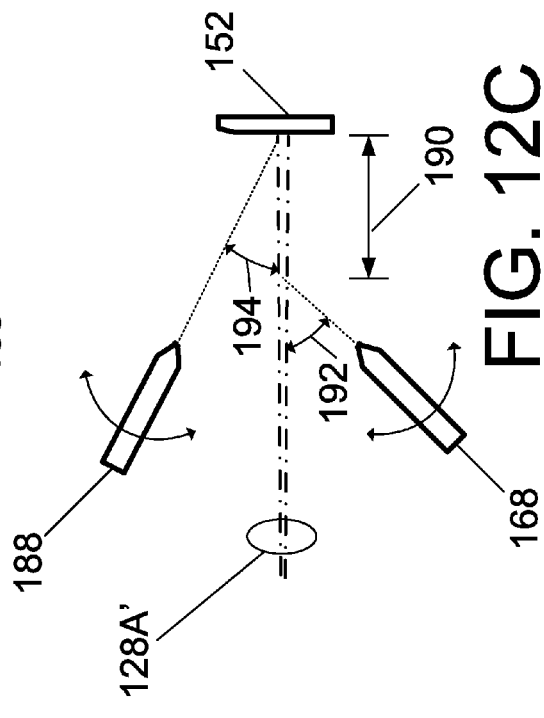

FIG. 12D illustrates another asymmetrical arrangement in which each of the first molecular beam 168 and the second molecular beam nozzle 188 have a different angles of incidence and different offset distances for their respective molecular beams. The first molecular beam may have a first angle of incidence 192 that is different from the second angle of incidence 196 for the second molecular beam. In this instance, the intersection of the GCIB 128A' with the two molecular beams may be at different locations. This is evidenced by the different offset distances 190, 198 for the two molecular beams. As shown in FIG. 12D, the asymmetry may be tied to the different angles of incidence 192, 196. However, the asymmetry may not be limited to different angles of incidence. In other embodiments, the location or arrangement of the first molecular beam nozzle 168 and the second molecular beam nozzle 188 in vertical or horizontal manner may enable the asymmetry. For example, the first molecular beam and the second molecular beam may share the same angle of incidence, but they may intersect the GCIB 128' in different locations. The different intersection locations may be based, at least in part, on the horizontal and/or vertical positioning the first molecular beam nozzle 168 and the second molecular beam nozzle 188 in the process chamber 108.

FIG. 12E illustrates another asymmetrical arrangement in which each of the first molecular beam and the second molecular beam have a different angles of incidence, but intersect the GCIB 128A' at substantially similar locations. Hence, the intersection points for both molecular beams share a similar offset distance 190. However, in this embodiment, the first molecular beam has a first angle of incidence 202 and the second molecular beam has a second angle of incidence 200 that is different from the first angle of incidence 202. To enable this embodiment, the positioning of the first molecular beam nozzle 168 and the second molecular beam nozzle 188 are optimized to produce the asymmetrical embodiments illustrated in FIG. 12E. This may include, but is not limited to, placing the first molecular beam nozzle 168 and the second molecular beam nozzle 188 at different horizontal and/or vertical distances from the GCIB 128A'.

FIG. 12F illustrates another asymmetrical arrangement in which each of the first molecular beam and the second molecular beam have a different angles of incidence, but intersect the GCIB 128A' at substantially different locations. For example, the molecular beam intersection differences are illustrated by the first offset distance 190 and the second offset distance 204 from the substrate 152. Additionally, the incidence angles 200, 202 may also be different as shown in FIG. 12F.

In FIG. 12G, illustrates another asymmetrical arrangement in which each of the first molecular beam and the second molecular beam have a different angles of incidence, but intersect the GCIB 128A' at substantially different locations. For example, the molecular beam intersection differences are illustrated by the offset distance 190 and the second molecular beam nozzle's 188 intersection point is at or near the surface of the substrate 152. Additionally, the incidence angles 200, 202 may also be different from each other.

FIG. 12H illustrates another asymmetrical arrangement in which each of the first molecular beam and the second molecular beam have a different angles of incidence, but intersect the GCIB 128A' at substantially similar locations at or near the surface of the substrate 152.

In other embodiments, the relative position of the one or more molecular beam nozzles (e.g., molecular beam nozzle 168) may also vary radially around the GCIB 128A'. For example, the radial position or angle (not shown) may be different than the incident angles shown in FIGS. 12A-12H. The radial distance between the one or more molecular beam nozzles may vary between zero and 360 degrees. In FIGS. 12A-12H, the first molecular beam nozzle 168 and the second molecular beam nozzle 188 are shown as being 180 degrees from each other in a radial direction around the GCIB 128A'. However, in other embodiments, the first molecular beam nozzle 168 and the second molecular beam nozzle 188 may be moved closer to each other in a radial direction around the GCIB 128A'.

In one dual molecular beam embodiment, the source gases that may be used to form the beam may be similar for both beams or they may be different. For example, in one embodiment, the molecular beams may include the same gas or mixture gas to form the molecular beams that may intersect the GCIB. The high pressure gas may include, but is not limited to, noble gases (e.g., Ar, Ne, etc.), nitrogen, oxidizing gases (e.g., $O_2$, $O_3$, etc.), or halogen gases (e.g., Cl-containing gas, F-containing gas, etc.). In another embodiment, the molecular beams may include a different source gas or mixtures of gases. For example, in one embodiment the first molecular beam may include Ar as a source gas, while the second molecular beam may include nitrogen as a source gas.

Figure 13:
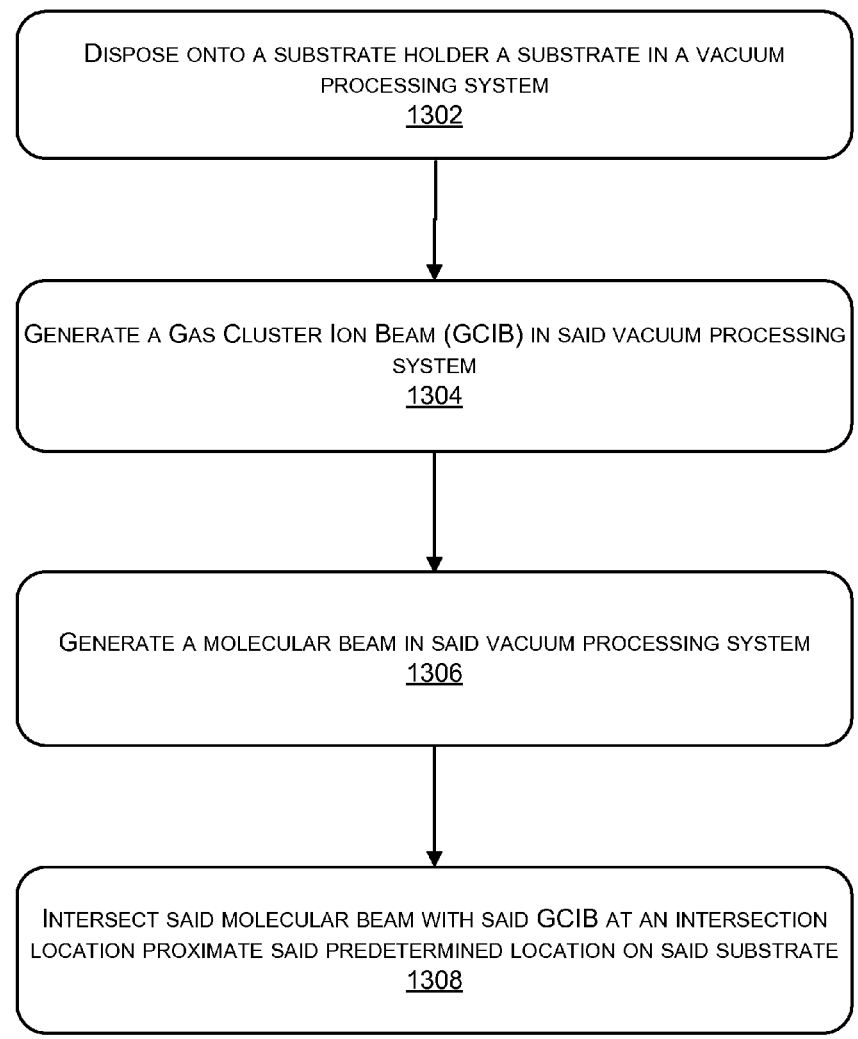
FIG. 13 is a flow chart illustrating a method for etching a substrate according to an embodiment.

FIG. 13 is a flow chart illustrating a method for etching or depositing on a substrate 152 using a GCIB processing system 1000 that incorporates one or more molecular beam nozzles 168. The molecular beam nozzle 168 may eject gas molecules in a narrow distribution through a small orifice. The method illustrated in FIG. 13 is merely one embodiment. Other methods may include additional steps or may omit a portion of the steps in FIG. 13. In another embodiment, the steps of the FIG. 13 method may be performed in any order and are not required to be performed in the order illustrated in FIG. 13.

At block 1302, the processing system 1000 may dispose a substrate 152 onto a substrate holder 162. The substrate 152 may include a semiconductor material or any other conductive material that may be etched by the processing system 1000. The substrate holder 162 may be enabled to move the substrate so that it intersects with the GCIB 128A' generated by the processing system 1000.

The processing system 1000 may generate a gas cluster ion beam (GCIB 128A') that may be used to etch or deposit a film on the substrate 152. FIGS. 5-9 provide a description of how the GCIB 128A' may be generated and provided to the substrate 152.

The substrate holder 162 may scan the substrate 152 through the GCIB 128A' such that said GCIB 128A' may intersect with the substrate 152 at a predetermined location and/or at a predetermined instant in time.

At block 1306, generating a molecular beam 174 using a molecular beam nozzle 168 located in the process chamber 108 of processing system 1000. As noted above in the description of FIGS. 10 through 12A-12H, one or more molecular beams 174 may be used influence the states of GCIB 128A' and/or the substrate 152 to etch or deposit a film on the substrate 152. In certain embodiments, the molecular beam generation may occur prior to scanning the substrate 152 through the GCIB 128A'.

At block 1308, the molecular beam 174 may intersect with the GCIB 128A' at an intersection location proximate to a predetermined location on the substrate 152. One intersection location 176 may be located at an offset distance 180 from the substrate 152. The intersection location 176 may generate a localized high pressure region that may alter the characteristics of the GCIB 128A'. Accordingly, the altered GCIB 128A' may be used to manipulate the etching or depositing being done on the surface of the substrate 128A'. As shown in FIGS. 11A-C and 12A-12H, the location of the intersection point may vary along the GCIB 128A' and may even include intersection at or just above the surface of the substrate 152.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A gas cluster ion beam (GCIB) system, comprising:
   a vacuum processing system;
   a gas cluster ion beam (GCIB) generating system configured to generate a GCIB in said vacuum processing system;
   a molecular beam generating system configured to generate a molecular beam in said vacuum processing system;
   a substrate holder configured to hold a substrate in a substrate plane, and positioned to intersect said substrate with said GCIB; and
   a scanning system coupled to said substrate holder, and configured to scan said substrate through said GCIB such that said GCIB intersects said substrate.

2. The GCIB processing system of claim 1, wherein said molecular beam intersects said GCIB at an exposed surface of said substrate.

3. The GCIB processing system of claim 1, wherein said molecular beam intersects said GCIB at a distance from an exposed surface of said substrate.

4. The GCIB processing system of claim 1, wherein said molecular beam generating system comprises a first molecular beam generating system, and further comprising a second molecular beam generating system in said vacuum processing system.

5. The GCIB processing system of claim 1, wherein said molecular beam is angled relative to said GCIB by an angular deviation ranging between 0 and 90 degrees, said angular deviation inclusive of 90 degrees.

6. The GCIB processing system of claim 5, wherein said GCIB is angled at a near normal incidence angle to said exposed surface of said substrate.

7. The GCIB processing system of claim 1, wherein said molecular beam and said GCIB are angled at a near normal incidence angle relative to said exposed surface of said substrate, and wherein said molecular beam and said GCIB are angled relative to one another by an angular deviation in the range of 5 to 45 degrees.

8. The GCIB processing system of claim 1, wherein said GCIB generating system comprises:
   a pressure nozzle;
   a nozzle skimmer located beyond an exit of said high pressure nozzle;

an ionizer located beyond an exit of said nozzle skimmer; and one or more accelerating electrodes arranged about said GCIB to accelerate said GCIB.

9. The GCIB processing system of claim 1, wherein said molecular beam generating system comprises a second pressure nozzle to generate a second molecular beam that interacts with the GCIB or the substrate.

10. The GCIB processing system of claim 1, wherein said molecular beam generating system comprises a third pressure nozzle to generate a third molecular beam that interacts with the GCIB or the substrate.

11. The GCIB processing system of claim 9, further comprising:

one or more high pressure sources coupled to said molecular beam generating system, and configured to supply a reactive gas or inert gas to said molecular beam generating system.

12. The GCIB processing system of claim 1, wherein the molecular beam generating system comprises a first molecular beam generating system and the molecular beam comprises a first molecular beam, and further comprising:

a second molecular beam generating system configured to generate a second molecular beam in said vacuum processing system, wherein said first molecular beam generating system and said second molecular beam generating system are arranged relative to each other and said GCIB generating system such that said first molecular beam intersects with said GCIB at a beam interaction location proximate said predetermined location on said substrate, and said second molecular beam intersects with said GCIB at a second beam interaction location proximate said predetermined location on said substrate.

13. The GCIB processing system of claim 1, further comprising:

a molecular beam positioning system coupled to said molecular beam generating system, and configured to alter an orientation of said molecular beam relative to said substrate.

14. The GCIB processing system of claim 13, wherein said molecular beam positioning system is configured to perform in-situ adjustment of an angular orientation of said molecular beam relative to said substrate plane.

15. A method of processing a substrate with a gas cluster ion beam (GCIB), comprising:

disposing onto a substrate holder said substrate in a vacuum processing system;

generating said gas cluster ion beam (GCIB) in said vacuum processing system;

generating a molecular beam in said vacuum processing system; and intersecting said molecular beam with said GCIB.

16. The method of claim 15, wherein said intersecting of said molecular beam with said GCIB comprises an angle of incidence between zero degrees and 90 degrees.

17. The method of claim 15, wherein said intersecting of said molecular beam and said GCIB occurs at an offset distance from said substrate.

18. The method of claim 15, wherein the generating of the molecular beam comprises providing one or more gases to a nozzle that can maintain a pressure differential between the inlet and a outlet, the one or more gases comprising a nitrogen-containing gas, a argon-containing gas, or a combination thereof.

19. The method of claim 18, wherein the one or more gases comprises a halogen-containing gas, an oxygen-containing gas, or a combination thereof.

20. The method of claim 15, wherein said molecular beam comprises a first molecular beam, and further comprising generating a second molecular beam that intersects with said GCIB.

* * * * *